(12) United States Patent
Kurtin

(10) Patent No.: US 9,368,693 B2
(45) Date of Patent: Jun. 14, 2016

(54) SEMICONDUCTOR STRUCTURE HAVING NANOCRYSTALLINE CORE AND NANOCRYSTALLINE SHELL PARING WITH COMPOSITIONAL TRANSITION LAYER

(71) Applicant: Juanita N. Kurtin, Hillsboro, OR (US)

(72) Inventor: Juanita N. Kurtin, Hillsboro, OR (US)

(73) Assignee: Pacific Light Technologies Corp., Portland, OR (US)

( * ) Notice: Subject to any disclaimer, the term of this patent is extended or adjusted under 35 U.S.C. 154(b) by 0 days.

(21) Appl. No.: 14/438,213

(22) PCT Filed: Oct. 11, 2013

(86) PCT No.: PCT/US2013/064678
§ 371 (c)(1),
(2) Date: Apr. 23, 2015

(87) PCT Pub. No.: WO2014/070423
PCT Pub. Date: May 8, 2014

(65) Prior Publication Data
US 2015/0295143 A1     Oct. 15, 2015

Related U.S. Application Data

(63) Continuation of application No. 13/663,300, filed on Oct. 29, 2012, now abandoned.

(51) Int. Cl.
*H01L 29/06*     (2006.01)
*H01L 31/00*     (2006.01)
(Continued)

(52) U.S. Cl.
CPC ............... *H01L 33/502* (2013.01); *B82Y 10/00* (2013.01); *C09K 11/025* (2013.01);
(Continued)

(58) Field of Classification Search
USPC ...................... 257/9, 13, 101; 438/47, 483, 22
See application file for complete search history.

(56) References Cited

U.S. PATENT DOCUMENTS 7,515,333 B1    4/2009    Empedocles
7,824,731 B2   11/2010    Ying et al.
(Continued)

FOREIGN PATENT DOCUMENTS

| KR | 10-2011-0140049 | 12/2011 |
|---|---|---|
| KR | 10-1159853 | 6/2012 |
| WO | WO-2009/020436 | 2/2009 |

OTHER PUBLICATIONS

Reiss, Peter et al., "Core/Shell Semiconductor Nanocrystals," Small, vol. 5, No. 2, (2009), pp. 154-168.
(Continued)

*Primary Examiner* — Errol Fernandes
(74) *Attorney, Agent, or Firm* — Blakely, Sokoloff, Taylor & Zafman

(57) ABSTRACT

Semiconductor structures having a nanocrystalline core and nanocrystalline shell pairing compositional transition layers are described. In an example, a semiconductor structure includes a nanocrystalline core composed of a first semiconductor material. A nanocrystalline shell composed of a second semiconductor material surrounds the nanocrystalline core. A compositional transition layer is disposed between, and in contact with, the nanocrystalline core and nanocrystalline shell and has a composition intermediate to the first and second semiconductor materials. In another example, a semiconductor structure includes a nanocrystalline core composed of a first semiconductor material. A nanocrystalline shell composed of a second semiconductor material surrounds the nanocrystalline core. A nanocrystalline outer shell surrounds the nanocrystalline shell and is composed of a third semiconductor material. A compositional transition layer is disposed between, and in contact with, the nanocrystalline shell and the nanocrystalline outer shell and has a composition intermediate to the second and third semiconductor materials.

23 Claims, 16 Drawing Sheets

(51) Int. Cl.
- *H01L 33/50* (2010.01)
- *H01L 29/12* (2006.01)
- *H01L 29/221* (2006.01)
- *C09K 11/02* (2006.01)
- *B82Y 10/00* (2011.01)
- *H01L 33/06* (2010.01)
- *C09K 11/88* (2006.01)
- *B82Y 20/00* (2011.01)

(52) U.S. Cl.
CPC ......... *C09K 11/883* (2013.01); *H01L 29/0665* (2013.01); *H01L 29/127* (2013.01); *H01L 29/221* (2013.01); *H01L 33/06* (2013.01); *B82Y 20/00* (2013.01)

(56) References Cited

U.S. PATENT DOCUMENTS

| | | | |
|---|---|---|---|
| 2005/0017260 A1 | 1/2005 | Lee | |
| 2006/0236918 A1 | 10/2006 | Jun et al. | |
| 2007/0122101 A1 | 5/2007 | Buretea et al. | |
| 2008/0182105 A1 | 7/2008 | Wang et al. | |
| 2008/0252209 A1* | 10/2008 | Jang .................. | C30B 7/14 313/506 |
| 2009/0032781 A1 | 2/2009 | Wang et al. | |
| 2009/0302304 A1 | 12/2009 | Peng et al. | |
| 2010/0288344 A1 | 11/2010 | Spitzer | |
| 2010/0308272 A1 | 12/2010 | Peng et al. | |
| 2011/0089375 A1 | 4/2011 | Chan et al. | |
| 2011/0124185 A1 | 5/2011 | Alivasatos et al. | |
| 2011/0175030 A1 | 7/2011 | Ren et al. | |
| 2011/0212561 A1 | 9/2011 | Banin et al. | |
| 2011/0226991 A1 | 9/2011 | Treadway et al. | |
| 2011/0274832 A1 | 11/2011 | Dai et al. | |
| 2012/0103404 A1 | 5/2012 | Fuke et al. | |
| 2012/0193605 A1 | 8/2012 | Gillies et al. | |
| 2013/0115455 A1 | 5/2013 | Banin et al. | |

OTHER PUBLICATIONS

Bhola N. Pal, et al., "Giant CdSe/CdS Core/Shell Nanocrystal Quantum Dots as Efficient Electroluminescent Materials; Strong Influence of Shell Thickness on Light-Emitting Diode Performance," Journal of the American Chemical Society, No. 12, (2012), pp. 331.

Xinhua Zhong, et al., "Composition-Tunable $Zn_xCd_{1-x}Se$ Nanocrystals with High Luminescence and Stability," Journal of the American Chemical Society, vol. 125, No. 28, (2003), pp. 8589-8594.

Yongfen Chen, et al., "Giant Multishell CdSe Nanocrystal Quantum Dots with Suppressed Blinking," Journal of the American Chemical Society, vol. 130, No. 15, (2008), pp. 5026-5027.

Xiaoyong Wang, et al., "Non-blinking semiconductor nanocrystals," Macmillan Publishers Limited, (2009), pp. 1-4.

Restriction Requirement for U.S. Appl. No. 13/663,300, mailed Nov. 7, 2013, 7 pages.

International Search Report and Written Opinion for International Patent Application No. PCT/US2013/064678, mailed Jan. 16, 2014, 13 pages.

Non-Final Office Action for U.S. Appl. No. 13/663,300, mailed Jan. 29, 2014, 33 pages.

Final Office Action for U.S. Appl. No. 13/663,300, mailed Jun. 3, 2014, 36 pages.

International Preliminary Report on Patentability for International Application No. PCT/US2013/064678, mailed May 14, 2015.

Non-Final Office Action for U.S. Appl. No. 14/506,513, mailed May 12, 2015, 24 pages.

* cited by examiner

SEMICONDUCTOR STRUCTURE HAVING NANOCRYSTALLINE CORE AND NANOCRYSTALLINE SHELL PARING WITH COMPOSITIONAL TRANSITION LAYER

CROSS-REFERENCE TO RELATED APPLICATIONS

This application is the U.S. National Phase application of PCT International Application No. PCT/US2013/064678, filed Oct. 11, 2013, and claims the benefit of U.S. patent application Ser. No. 13/663,300, filed Oct. 29, 2012, the entire disclosures of both of which are incorporated herein by reference.

TECHNICAL FIELD

Embodiments of the present invention are in the field of quantum dots and, in particular, semiconductor structures having a nanocrystalline core and nanocrystalline shell pairing with one or more compositional transition layers.

BACKGROUND

Quantum dots having a high photoluminescence quantum yield (PLQY) may be applicable as down-converting materials in down-converting nanocomposites used in solid state lighting applications. Down-converting materials are used to improve the performance, efficiency and color choice in lighting applications, particularly light emitting diodes (LEDs). In such applications, quantum dots absorb light of a particular first (available or selected) wavelength, usually blue, and then emit light at a second wavelength, usually red or green.

SUMMARY

Embodiments of the present invention include semiconductor structures having a nanocrystalline core and nanocrystalline shell pairing with one or more compositional transition layers.

In an embodiment, a semiconductor structure includes a nanocrystalline core composed of a first semiconductor material. A nanocrystalline shell composed of a second, different, semiconductor material at least partially surrounds the nanocrystalline core. A compositional transition layer is disposed between, and in contact with, the nanocrystalline core and nanocrystalline shell. The compositional transition layer has a composition intermediate to the first and second semiconductor materials.

In another embodiment, a semiconductor structure includes a nanocrystalline core composed of a first semiconductor material. A nanocrystalline shell composed of a second, different, semiconductor material at least partially surrounds the nanocrystalline core. A nanocrystalline outer shell at least partially surrounds the nanocrystalline shell and is composed of a third semiconductor material different from the first and second semiconductor materials. A compositional transition layer is disposed between, and in contact with, the nanocrystalline shell and the nanocrystalline outer shell. The compositional transition layer has a composition intermediate to the second and third semiconductor materials.

In another embodiment, a composite includes a matrix material and a plurality of semiconductor structures embedded in the matrix material. Each semiconductor structure includes a nanocrystalline core composed of a first semiconductor material. A nanocrystalline shell composed of a second, different, semiconductor material at least partially surrounds the nanocrystalline core. A compositional transition layer is disposed between, and in contact with, the nanocrystalline core and nanocrystalline shell. The compositional transition layer has a composition intermediate to the first and second semiconductor materials. An amorphous insulator coating surrounds and encapsulates the nanocrystalline core/nanocrystalline shell pairing.

In another embodiment, a composite includes a matrix material and a plurality of semiconductor structures embedded in the matrix material. Each semiconductor structure includes a nanocrystalline core composed of a first semiconductor material. A nanocrystalline shell composed of a second, different, semiconductor material at least partially surrounds the nanocrystalline core. A nanocrystalline outer shell at least partially surrounds the nanocrystalline shell and is composed of a third semiconductor material different from the first and second semiconductor materials. A compositional transition layer is disposed between, and in contact with, the nanocrystalline shell and the nanocrystalline outer shell. The compositional transition layer has a composition intermediate to the second and third semiconductor materials. An amorphous insulator coating surrounds and encapsulates the nanocrystalline core/nanocrystalline shell/nanocrystalline outer shell combination.

DETAILED DESCRIPTION

Semiconductor structures having a nanocrystalline core and nanocrystalline shell pairing with one or more compositional transition layers are described herein. In the following description, numerous specific details are set forth, such as specific quantum dot geometries and efficiencies, in order to provide a thorough understanding of embodiments of the present invention. It will be apparent to one skilled in the art that embodiments of the present invention may be practiced without these specific details. In other instances, well-known related apparatuses, such as the host of varieties of applicable light emitting diodes (LEDs), are not described in detail in order to not unnecessarily obscure embodiments of the present invention. Furthermore, it is to be understood that the various embodiments shown in the figures are illustrative representations and are not necessarily drawn to scale.

Also disclosed herein are quantum dots having high photoluminescence quantum yields (PLQY's) and methods of making and encapsulating such quantum dots. A high PLQY is achieved by using a synthetic process that significantly reduces the defects and self absorption found in prior art quantum dots. The resulting geometries of the quantum dots may include non-spherical quantum dot cores shelled with a rod-shaped shell. The aspect or volume ratio of the core/shell pairing may be controlled by monitoring the reaction process used to fabricate the pairing. Uses of quantum dot compositions having high PLQYs are also disclosed, including solid state lighting. Other applications include biological imaging and fabrication of photovoltaic devices.

As a reference point, quantum dots based on a spherical cadmium selenide (CdSe) core embedded in a cadmium sulfide (CdS) nanorod shell have been reported. Such quantum dots do not have a high PLQY. Typically, prior art core/shell quantum dots suffer from several structural deficiencies which may contribute to a reduced PLQY. For example, prior art core/shell quantum dots used for down-shifting applications typically have overlapping absorption and emission profiles. Profile overlap may be attributed to core material selection such that both the absorption and emission of the quantum dot is controlled by the size, shape, and composition of the core quantum dot, and the shell, if any, is used only as a passivating layer for the surface. However, the prior art arrangement leads to a significant amount of self-absorption (re-absorption of the down-shifted light), which decreases the measured PLQY. Accordingly, a typical prior art core/shell quantum dot PLQY is below 80% which is often not high enough for device applications. Also, prior art core/shell quantum dots suffer from self absorption due in part to inappropriate volume of core/shell material.

Figure 1:
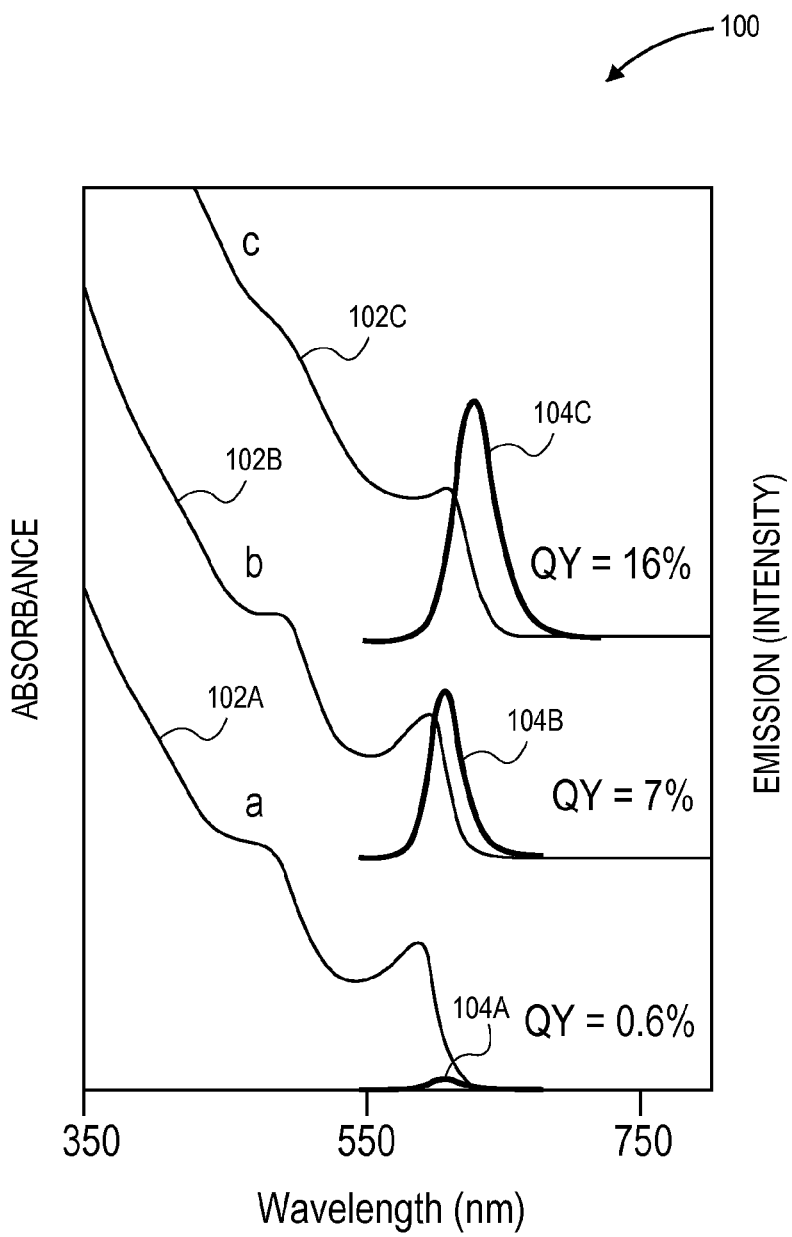
FIG. 1 depicts a plot of prior art core/shell absorption (left y-axis) and emission spectra intensity (right y-axis) as a function of wavelength for conventional quantum dots.

As an example, FIG. 1 depicts a plot 100 of prior art core/shell absorption and emission spectra intensity as a function of wavelength for conventional quantum dots. The absorption spectra (102a, 102b, 102c) are of CdSe core nanorods for a same core size with different thickness shells (a, b, c). FIG. 1 also depicts the emission spectra (104a, 104b, 104c) of the three core/shell quantum dots after exposure to blue or UV light. The absorption spectrum and the emission spectrum overlap for each thickness of shell.

The low PLQY of prior art quantum dots is also attributed to poor nanocrystal surface and crystalline quality. The poor quality may result from a previous lack of capability in synthetic techniques for treating or tailoring the nanocrystal surface in order to achieve PLQYs above 90 percent. For example, the surface may have a large number of dangling bonds which act as trap states to reduce emission and, hence, PLQY. Previous approaches to address such issues have included use of a very thin shell, e.g., approximately ½ monolayer to 5 monolayers, or up to about 1.5 nm of thickness, to preserve the epitaxial nature of the shell. However, a PLQY of only 50-80% has been achieved. In such systems, considerable self-absorption may remain, decreasing the PLQY in many device applications. Other approaches have included attempts to grow a very large volume of up to 19 monolayers, or about 6 nm of shell material on a nanometer-sized quantum dot. However, the results have been less than satisfactory due to mismatched lattice constants between the core and shell material.

Conventionally, a spherical shell is grown on a spherical core in order to fabricate a core/shell quantum dot system. However, if too much volume of shell material is added to the core, the shell often will to crack due to strain. The strain introduces defects and decreases the PLQY. Band-edge emission from the quantum dots is then left to compete with both radiative and non-radiative decay channels, originating from defect electronic states. Attempts have been made to use an organic molecule as a passivating agent in order to improve the size-dependent band-edge luminescence efficiency, while preserving the solubility and processability of the particles. Unfortunately, however, passivation by way of organic molecule passivation is often incomplete or reversible, exposing some regions of the surface of a quantum dot to degradation effects such as photo-oxidation. In some cases, chemical degradation of the ligand molecule itself or its exchange with other ligands results in fabrication of poor quality quantum dots.

One or more embodiments of the present invention address at least one or more of the above issues regarding quantum dot quality and behavior and the impact on PLQY of the fabricated quantum dots. In one approach, the quality of quantum dot particle interfaces is improved over conventional systems. For example, in one embodiment, high PLQY and temperature stability of a fabricated (e.g., grown) quantum dot is centered on the passivation or elimination of internal (at the seed/rod interface) and external (at the rod surface) interface defects that provide non-radiative recombination pathways for electron-hole pairs that otherwise compete with a desirable radiative recombination. This approach may be generally coincident with maximizing the room-temperature PLQY of the quantum dot particles. Thus, thermal escape paths from the quantum dot, assisted by quantum dot photons, are mitigated as a primary escape mechanism for thermally excited carriers. Although the chemical or physical nature of such trap states has not been phenomenologically explored, suitably tuning electron density at the surface may deactivate trap states. Such passivation is especially important at increased temperatures, where carriers have sufficient thermal energy to access a larger manifold of these states.

In an embodiment, approaches described herein exploit the concept of trap state deactivation. Furthermore, maintenance of such a deactivation effect over time is achieved by insulating a quantum dot interface and/or outer most surface from an external environment. The deactivation of surface states is also important for the fabrication of polymer composites including quantum dots, particularly in the case where the polymer composite is exposed to a high flux light-source (as is the case for solid-state lighting, SSL) where it is possible for some of the particles to have more than one exciton. The multi-excitons may recombine radiatively or non-radiatively via Auger recombination to a single exciton state. For non-passivated quantum dot systems, the Auger rate increases with particle volume and with exciton population. However, in an embodiment, a thick, high quality, asymmetric shell of (e.g., of CdS) is grown on well-formed seeds (e.g., CdSe) to mitigate Auger rate increase.

One or more embodiments described herein involve an optimized synthesis of core/shell quantum dots. In a specific example, high PLQY and temperature stable quantum dots are fabricated from CdSe/CdS core-shell nanorods. In order to optimize the quantum dots in place of light emitting diode (LED) phosphors, the temperature stability of the quantum dots is enhanced, and the overall PLQY increased. Such improved performance is achieved while maintaining high absorption and narrow emission profiles for the quantum dots. In one such embodiment, materials systems described herein are tailored for separate optimization of absorption and emission by employing a core/shell structure. The core material predominantly controls the emission and the shell material predominantly controls the absorption. The described systems enable separate optimization of absorption and emission and provides very little overlap of the absorption and emission to minimize re-absorption of any emitted light by the quantum dot material (i.e., self-absorption).

Figure 2:
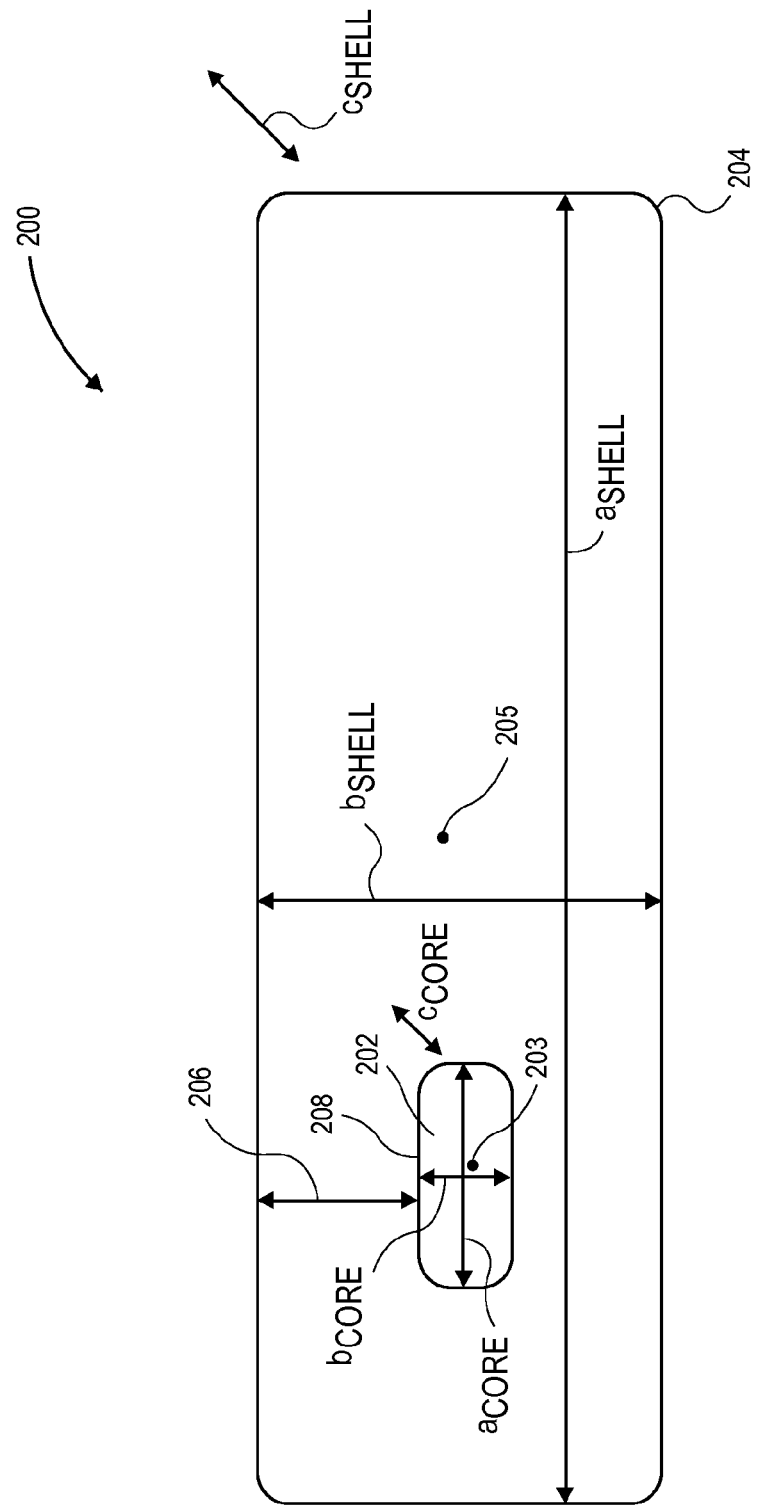
FIG. 2 illustrates a schematic of a cross-sectional view of a quantum dot, in accordance with an embodiment of the present invention.

Several factors may be intertwined for establishing an optimized geometry for a quantum dot having a nanocrystalline core and naocrystalline shell pairing. As a reference, FIG. 2 illustrates a schematic of a cross-sectional view of a quantum dot, in accordance with an embodiment of the present invention. Referring to FIG. 2, a semiconductor structure (e.g., a quantum dot structure) 200 includes a nanocrystalline core 202 surrounded by a nanocrystalline shell 204. The nanocrystalline core 202 has a length axis ($a_{CORE}$), a width axis ($b_{CORE}$) and a depth axis ($c_{CORE}$), the depth axis provided into and out of the plane shown in FIG. 2. Likewise, the nanocrystalline shell 204 has a length axis ($a_{SHELL}$), a width axis ($b_{SHELL}$) and a depth axis ($c_{SHELL}$), the depth axis provided into and out of the plane shown in FIG. 2. The nanocrystalline core 202 has a center 203 and the nanocrystalline shell 204 has a center 205. The nanocrystalline shell 204 surrounds the nanocrystalline core 202 in the b-axis direction by an amount 206, as is also depicted in FIG. 2.

The following are attributes of a quantum dot that may be tuned for optimization, with reference to the parameters provided in FIG. 2, in accordance with embodiments of the present invention. Nanocrystalline core 202 diameter (a, b or c) and aspect ratio (e.g., a/b) can be controlled for rough tuning for emission wavelength (a higher value for either providing increasingly red emission). A smaller overall nanocrystalline core provides a greater surface to volume ratio. The width of the nanocrystalline shell along 206 may be tuned for yield optimization and quantum confinement providing approaches to control red-shifting and mitigation of surface effects. However, strain considerations must be accounted for when optimizing the value of thickness 206. The length ($a_{SHELL}$) of the shell is tunable to provide longer radiative decay times as well as increased light absorption. The overall aspect ratio of the structure 200 (e.g., the greater of $a_{SHELL}/b_{SHELL}$ and $a_{SHELL}/c_{SHELL}$) may be tuned to directly impact PLQY. Meanwhile, overall surface/volume ratio for 200 may be kept relatively smaller to provide lower surface defects, provide higher photoluminescence, and limit self-absorption. Referring again to FIG. 2, the shell/core interface 208 may be tailored to avoid dislocations and strain sites. In one such embodiment, a high quality interface is obtained by tailoring one or more of injection temperature and mixing parameters, the use of surfactants, and control of the reactivity of precursors, as is described in greater detail below.

In accordance with an embodiment of the present invention, a high PLQY quantum dot is based on a core/shell pairing using an anisotropic core. With reference to FIG. 2, an anisotropic core is a core having one of the axes $a_{CORE}$, $b_{CORE}$ or $c_{CORE}$ different from one or both of the remaining axes. An aspect ratio of such an anisotropic core is determined by the longest of the axes $a_{CORE}$, $b_{CORE}$ or $c_{CORE}$ divided by the shortest of the axes $a_{CORE}$, $b_{CORE}$ or $c_{CORE}$ to provide a number greater than 1 (an isotropic core has an aspect ratio of 1). It is to be understood that the outer surface of an anisotropic core may have rounded or curved edges (e.g., as in an ellipsoid) or may be faceted (e.g., as in a stretched or elongated tetragonal or hexagonal prism) to provide an aspect ratio of greater than 1 (note that a sphere, a tetragonal prism, and a hexagonal prism are all considered to have an aspect ratio of 1 in keeping with embodiments of the present invention).

A workable range of aspect ratio for an anisotropic nanocrystalline core for a quantum dot may be selected for maximization of PLQY. For example, a core essentially isotropic may not provide advantages for increasing PLQY, while a core with too great an aspect ratio (e.g., 2 or greater) may present challenges synthetically and geometrically when forming a surrounding shell. Furthermore, embedding the core in a shell composed of a material different than the core may also be used enhance PLQY of a resulting quantum dot.

Accordingly, in an embodiment, a semiconductor structure includes an anisotropic nanocrystalline core composed of a first semiconductor material and having an aspect ratio between, but not including, 1.0 and 2.0. The semiconductor structure also includes a nanocrystalline shell composed of a second, different, semiconductor material at least partially surrounding the anisotropic nanocrystalline core. In one such embodiment, the aspect ratio of the anisotropic nanocrystalline core is approximately in the range of 1.01-1.2 and, in a particular embodiment, is approximately in the range of 1.1-1.2. In the case of rounded edges, then, the nanocrystalline core may be substantially, but not perfectly, spherical. However, the nanocrystalline core may instead be faceted. In an embodiment, the anisotropic nanocrystalline core is disposed in an asymmetric orientation with respect to the nanocrystalline shell, as described in greater detail in the example below.

Another consideration for maximization of PLQY in a quantum dot structure is to provide an asymmetric orientation of the core within a surrounding shell. For example, referring again to FIG. 2, the center 203 of the core 202 may be misaligned with (e.g., have a different spatial point than) the center 205 of the shell 204. In an embodiment, a semiconductor structure includes an anisotropic nanocrystalline core composed of a first semiconductor material. The semiconductor structure also includes a nanocrystalline shell composed of a second, different, semiconductor material at least partially surrounding the anisotropic nanocrystalline core. The anisotropic nanocrystalline core is disposed in an asymmetric orientation with respect to the nanocrystalline shell. In one such embodiment, the nanocrystalline shell has a long axis (e.g., $a_{SHELL}$), and the anisotropic nanocrystalline core is disposed off-center along the long axis. In another such embodiment, the nanocrystalline shell has a short axis (e.g., $b_{SHELL}$), and the anisotropic nanocrystalline core is disposed off-center along the short axis. In yet another embodiment, however, the nanocrystalline shell has a long axis (e.g., $a_{SHELL}$) and a short axis (e.g., $b_{SHELL}$), and the anisotropic nanocrystalline core is disposed off-center along both the long and short axes.

With reference to the above described nanocrystalline core and nanocrystalline shell pairings, in an embodiment, the nanocrystalline shell completely surrounds the anisotropic nanocrystalline core. In an alternative embodiment, however, the nanocrystalline shell only partially surrounds the anisotropic nanocrystalline core, exposing a portion of the anisotropic nanocrystalline core, e.g., as in a tetrapod geometry or arrangement. In an embodiment, the nanocrystalline shell is an anisotropic nanocrystalline shell, such as a nanorod, that surrounds the anisotropic nanocrystalline core at an interface between the anisotropic nanocrystalline shell and the anisotropic nanocrystalline core. The anisotropic nanocrystalline shell passivates or reduces trap states at the interface. The anisotropic nanocrystalline shell may also, or instead, deactivate trap states at the interface.

With reference again to the above described nanocrystalline core and nanocrystalline shell pairings, in an embodiment, the first and second semiconductor materials (core and shell, respectively) are each materials such as, but not limited to, Group II-VI materials, Group III-V materials, Group IV-VI materials, Group I-III-VI materials, or Group II-IV-VI materials and, in one embodiment, are monocrystalline. In one such embodiment, the first and second semiconductor materials are both Group II-VI materials, the first semiconductor material is cadmium selenide (CdSe), and the second semiconductor material is one such as, but not limited to, cadmium sulfide (CdS), zinc sulfide (ZnS), or zinc selenide (ZnSe). In an embodiment, the semiconductor structure further includes a nanocrystalline outer shell at least partially surrounding the nanocrystalline shell and, in one embodiment, the nanocrystalline outer shell completely surrounds the nanocrystalline shell. The nanocrystalline outer shell is composed of a third semiconductor material different from the first and second semiconductor materials. In a particular such embodiment, the first semiconductor material is cadmium selenide (CdSe), the second semiconductor material is cadmium sulfide (CdS), and the third semiconductor material is zinc sulfide (ZnS).

With reference again to the above described nanocrystalline core and nanocrystalline shell pairings, in an embodiment, the semiconductor structure (i.e., the core/shell pairing in total) has an aspect ratio approximately in the range of 1.5-10 and, 3-6 in a particular embodiment. In an embodiment, the nanocrystalline shell has a long axis and a short axis. The long axis has a length approximately in the range of 5-40 nanometers. The short axis has a length approximately in the range of 1-5 nanometers greater than a diameter of the anisotropic nanocrystalline core parallel with the short axis of the nanocrystalline shell. In a specific such embodiment, the anisotropic nanocrystalline core has a diameter approximately in the range of 2-5 nanometers. The thickness of the nanocrystalline shell on the anisotropic nanocrystalline core along a short axis of the nanocrystalline shell is approximately in the range of 1-5 nanometers of the second semiconductor material.

With reference again to the above described nanocrystalline core and nanocrystalline shell pairings, in an embodiment, the anisotropic nanocrystalline core and the nanocrystalline shell form a quantum dot. In one such embodiment, the quantum dot has a photoluminescence quantum yield (PLQY) of at least 90%. Emission from the quantum dot may be mostly, or entirely, from the nanocrystalline core. For example, in an embodiment, emission from the anisotropic nanocrystalline core is at least approximately 75% of the total emission from the quantum dot. An absorption spectrum and an emission spectrum of the quantum dot may be essentially non-overlapping. For example, in an embodiment, an absorbance ratio of the quantum dot based on absorbance at 400 nanometers versus absorbance at an exciton peak for the quantum dot is approximately in the range of 5-35.

In an embodiment, a quantum dot based on the above described nanocrystalline core and nanocrystalline shell pairings is a down-converting quantum dot. However, in an alternative embodiment, the quantum dot is an up-shifting quantum dot. In either case, a lighting apparatus may include a light emitting diode and a plurality of quantum dots such as those described above. The quantum dots may be applied proximal to the LED and provide down-conversion or up-shifting of light emitted from the LED. Thus, semiconductor structures according to the present invention may be advantageously used in solid state lighting. The visible spectrum includes light of different colors having wavelengths between about 380 nm and about 780 nm that are visible to the human eye. An LED will emit a UV or blue light which is down-converted (or up-shifted) by semiconductor structures described herein. Any suitable ratio of emission color from the semiconductor structures may be used in devices of the present invention. LED devices according to embodiments of the present invention may have incorporated therein sufficient quantity of semiconductor structures (e.g., quantum dots) described herein capable of down-converting any available blue light to red, green, yellow, orange, blue, indigo, violet or other color. These structures may also be used to downconvert or upconvert lower energy light (green, yellow, etc) from LED devices, as long as the excitation light produces emission from the structures.

Semiconductor structures according to embodiments of the present invention may be advantageously used in biological imaging in, e.g., one or more of the following environments: fluorescence resonance energy transfer (FRET) analysis, gene technology, fluorescent labeling of cellular proteins, cell tracking, pathogen and toxin detection, in vivo animal imaging or tumor biology investigation. Accordingly, embodiments of the present invention contemplate probes having quantum dots described herein.

Semiconductor structures according to embodiments of the present invention may be advantageously used in photovoltaic cells in layers where high PLQY is important. Accordingly, embodiments of the present invention contemplate photovoltaic devices using quantum dots described herein.

Semiconductor structures according to embodiments of the present invention may be advantageously used in display applications as phosphor replacements where high PLQY is important. Accordingly, embodiments of the present invention contemplate display devices using quantum dots described herein.

There are various synthetic approaches for fabricating CdSe quantum dots. For example, in an embodiment, under an inert atmosphere (e.g., ultra high purity (UHP) argon), cadmium oxide (CdO) is dissociated in the presence of surfactant (e.g., octadecylphosphonic acid (ODPA)) and solvent (e.g., trioctylphopshine oxide (TOPO); trioctylphosphine (TOP)) at high temperatures (e.g., 350-380 degrees Celsius). Resulting $Cd^{2+}$ cations are exposed by rapid injection to solvated selenium anions ($Se^{2-}$), resulting in a nucleation event forming small CdSe seeds. The seeds continue to grow, feeding off of the remaining $Cd^{2+}$ and $Se^{2-}$ available in solution, with the resulting quantum dots being stabilized by surface interactions with the surfactant in solution (ODPA). The aspect ratio of the CdSe seeds is typically between 1 and 2, as dictated by the ratio of the ODPA to the Cd concentration in solution. The quality and final size of these cores is affected by several variables such as, but not limited to, reaction time, temperature, reagent concentration, surfactant concentration, moisture content in the reaction, or mixing rate. The reaction is targeted for a narrow size distribution of CdSe seeds (assessed by transmission electron microscopy (TEM)), typically a slightly cylindrical seed shape (also assessed by TEM) and CdSe seeds exhibiting solution stability over time (assessed by PLQY and scattering in solution).

For the cadmium sulfide (CdS) shell growth on the CdSe seeds, or nanocrystalline cores, under an inert atmosphere (e.g. UHP argon), cadmium oxide (CdO) is dissociated in the presence of surfactants (e.g., ODPA and hexylphosphonic acid (HPA)) and solvent (e.g. TOPO and/or TOP) at high temperatures (e.g., 350-380 degrees Celsius). The resulting $Cd^{2+}$ cations in solution are exposed by rapid injection to solvated sulfur anions ($S^{2-}$) and CdSe cores. Immediate growth of the CdS shell around the CdSe core occurs. The use of both a short chain and long chain phosphonic acid promotes enhanced growth rate at along the c-axis of the structure, and slower growth along the a-axis, resulting in a rod-shaped core/shell nanomaterial.

CdSe/CdS core-shell quantum dots have been shown in the literature to exhibit respectable quantum yields (e.g., 70-75%). However, the persistence of surface trap states (which decrease overall photoluminescent quantum yield) in these systems arises from a variety of factors such as, but not limited to, strain at the core-shell interface, high aspect ratios (ratio of rod length to rod width of the core/shell pairing) which lead to larger quantum dot surface area requiring passivation, or poor surface stabilization of the shell.

In order to address the above synthetic limitations on the quality of quantum dots formed under conventional synthetic procedures, in an embodiment, a multi-faceted approach is used to mitigate or eliminate sources of surface trap states in quantum dot materials. For example, lower reaction temperatures during the core/shell pairing growth yields slower growth at the CdSe—CdS interface, giving each material sufficient time to orient into the lowest-strain positions. Aspect ratios are controlled by changing the relative ratios of surfactants in solution as well as by controlling temperature. Increasing an ODPA/HPA ratio in reaction slows the rapid growth at the ends of the core/shell pairings by replacing the facile HPA surfactant with the more obstructive ODPA surfactant. In addition, lowered reaction temperatures are also used to contribute to slowed growth at the ends of the core/shell pairings. By controlling these variables, the aspect ratio of the core/shell pairing is optimized for quantum yield. In one such embodiment, following determination of optimal surfactant ratios, overall surfactant concentrations are adjusted to locate a PLQY maximum while maintaining long-term stability of the fabricated quantum dots in solution.

Furthermore, in an embodiment, aspect ratios of the seed or core (e.g., as opposed to the seed/shell pairing) are limited to a range between, but not including 1.0 and 2.0 in order to provide an appropriate geometry for high quality shell growth thereon.

In another aspect, an additional or alternative strategy for improving the interface between CdSe and CdS includes, in an embodiment, chemically treating the surface of the CdSe cores prior to reaction. CdSe cores are stabilized by long chain surfactants (ODPA) prior to introduction into the CdS growth conditions. Reactive ligand exchange can be used to replace the ODPA surfactants with ligands which are easier to remove (e.g., primary or secondary amines), facilitating improved reaction between the CdSe core and the CdS growth reagents.

In addition to the above factors affecting PLQY in solution, self-absorption may negatively affect PLQY when these materials are cast into films. This phenomenon may occur when CdSe cores re-absorb light emitted by other quantum dots. In one embodiment, the thickness of the CdS shells around the same CdSe cores is increased in order to increase the amount of light absorbed per core/shell pairing, while keeping the particle concentration the same or lower in films including the quantum dot structures. The addition of more Cd and S to the shell formation reaction leads to more shell growth, while an optimal surfactant ratio allows targeting of a desired aspect ratio and solubility of the core/shell pairing.

Accordingly, in an embodiment, an overall method of fabricating a semiconductor structure, such as the above described quantum dot structures, includes forming an anisotropic nanocrystalline core from a first semiconductor material. A nanocrystalline shell is formed from a second, different, semiconductor material to at least partially surround the anisotropic nanocrystalline core. In one such embodiment, the anisotropic nanocrystalline core has an aspect ratio between, but not including, 1.0 and 2.0, as described above.

With reference to the above described general method for fabricating a nanocrystalline core and nanocrystalline shell pairing, in an embodiment, prior to forming the nanocrystalline shell, the anisotropic nanocrystalline core is stabilized in solution with a surfactant. In one such embodiment, the surfactant is octadecylphosphonic acid (ODPA). In another such embodiment, the surfactant acts as a ligand for the anisotropic nanocrystalline core. In that embodiment, the method further includes, prior to forming the nanocrystalline shell, replacing the surfactant ligand with a second ligand, the second ligand more labile than the surfactant ligand. In a specific such embodiment, the second ligand is one such as, but not limited to, a primary amine or a secondary amine.

With reference again to the above described general method for fabricating a nanocrystalline core and nanocrystalline shell pairing, in an embodiment, forming the nanocrystalline shell includes forming the second semiconductor material in the presence of a mixture of surfactants. In one such embodiment, the mixture of surfactants includes a mixture of octadecylphosphonic acid (ODPA) and hexylphosphonic acid (HPA). In a specific such embodiment, forming the nanocrystalline shell includes tuning the aspect ratio of the nanocrystalline shell by tuning the ratio of ODPA versus HPA. Forming the second semiconductor material in the presence of the mixture of surfactants may also, or instead, include using a solvent such as, but not limited to, trioctylphosphine oxide (TOPO) and trioctylphosphine (TOP).

With reference again to the above described general method for fabricating a nanocrystalline core and nanocrystalline shell pairing, in an embodiment, forming the anisotropic nanocrystalline core includes forming at a temperature approximately in the range of 350-380 degrees Celsius. In an embodiment, forming the anisotropic nanocrystalline core includes forming a cadmium selenide (CdSe) nanocrystal from cadmium oxide (CdO) and selenium (Se) in the presence of a surfactant at a temperature approximately in the range of 300-400 degrees Celsius. The reaction is arrested prior to completion. In one such embodiment, forming the nanocrystalline shell includes forming a cadmium sulfide (CdS) nanocrystalline layer on the CdSe nanocrystal from cadmium oxide (CdO) and sulfur (S) at a temperature approximately in the range of 120-380 degrees Celsius. That reaction is also arrested prior to completion.

The aspect ratio of the fabricated semiconductor structures may be controlled by one of several methods. For example, ligand exchange may be used to change the surfactants and/or ligands and alter the growth kinetics of the shell and thus the aspect ratio. Changing the core concentration during core/shell growth may also be exploited. An increase in core concentration and/or decrease concentration of surfactants results in lower aspect ratio core/shell pairings. Increasing the concentration of a shell material such as S for CdS will increase the rate of growth on the ends of the core/shell pairings, leading to longer, higher aspect ratio core/shell pairings.

As mentioned above, in one embodiment of the present invention, nanocrystalline cores undergo a reactive ligand exchange which replaces core surfactants with ligands that are easier to remove (e.g., primary or secondary amines), facilitating better reaction between the CdSe core and the CdS growth reagents. In one embodiment, cores used herein have ligands bound or associated therewith. Attachment may be by dative bonding, Van der Waals forces, covalent bonding, ionic bonding or other force or bond, and combinations thereof. Ligands used with the cores may include one or more functional groups to bind to the surface of the nanocrystals. In a specific such embodiment, the ligands have a functional group with an affinity for a hydrophobic solvent.

In an embodiment, lower reaction temperatures during shell growth yields slower growth at the core/shell interface. While not wishing to be bound by any particular theory or principle it is believed that this method allows both core and shell seed crystals time to orient into their lowest-strain positions during growth. Growth at the ends of the core/shell pairing structure is facile and is primarily governed by the concentration of available precursors (e.g., for a shell of CdS this is Cd, S:TOP). Growth at the sides of the core/shell pairings is more strongly affected by the stabilizing ligands on the surface of the core/shell pairing. Ligands may exist in equilibrium between the reaction solution and the surface of the core/shell pairing structure. Lower reaction temperatures may tilt this equilibrium towards more ligands being on the surface, rendering it more difficult for growth precursors to access this surface. Hence, growth in the width direction is hindered by lower temperature, leading to higher aspect ratio core/shell pairings.

In general consideration of the above described semiconductor or quantum dot structures and methods of fabricating such semiconductor or quantum dot structures, in an embodiment, quantum dots are fabricated to have an absorbance in the blue or ultra-violet (V) regime, with an emission in the visible (e.g., red, orange, yellow, green, blue, indigo and violet, but particularly red and green) regime. The above described quantum dots may advantageously possess a high PLQY with limited self-absorption, possess a narrow size distribution for cores, provide core stability over time (e.g., as assessed by PLQY and scattering in solution), and exhibit no major product loss during purification steps. Quantum dots fabricated according one or more of the above embodiments may have a decoupled absorption and emission regime, where the absorption is controlled by the shell and the emission is controlled by the core. In one such embodiment, a dimension of the core correlates with emission color, e.g., a core diameter progressing from 3-5.5 nanometers correlates approximately to a green→yellow→red emission progression.

With reference to the above described embodiments concerning semiconductor structures, such as quantum dots, and methods of fabricating such structures, the concept of a crystal defect, or mitigation thereof, may be implicated. For example, a crystal defect may form in, or be precluded from forming in, a nanocrystalline core or in a nanocrystalline shell, at an interface of the core/shell pairing, or at the surface of the core or shell. In an embodiment, a crystal defect is a departure from crystal symmetry caused by on or more of free surfaces, disorder, impurities, vacancies and interstitials, dislocations, lattice vibrations, or grain boundaries. Such a departure may be referred to as a structural defect or lattice defect. Reference to an exciton is to a mobile concentration of energy in a crystal formed by an excited electron and an associated hole. An exciton peak is defined as the peak in an absorption spectrum correlating to the minimum energy for a ground state electron to cross the band gap. The core/shell quantum dot absorption spectrum appears as a series of overlapping peaks that get larger at shorter wavelengths. Because of their discrete electron energy levels, each peak corresponds to an energy transition between discrete electron-hole (exciton) energy levels. The quantum dots do not absorb light that has a wavelength longer than that of the first exciton peak, also referred to as the absorption onset. The wavelength of the first exciton peak, and all subsequent peaks, is a function of the composition and size of the quantum dot. An absorbance ratio is absorbance of the core/shell nanocrystal at 400 nm divided by the absorbance of the core/shell nanocrystal at the first exciton peak. Photoluminescence quantum yield (PLQY) is defined as the ratio of the number of photons emitted to the number of photons absorbed. Core/shell pairing described herein may have a Type 1 band alignment, e.g., the core band gap is nested within the band gap of the shell. Emission wavelength may be determined by controlling the size and shape of the core nanocrystal, which controls the band gap of the core. Emission wavelength may also be engineered by controlling the size and shape of the shell. In an embodiment, the amount/volume of shell material is much greater than that of the core material. Consequently, the absorption onset wavelength is mainly controlled by the shell band gap. Core/shell quantum dots in accordance with an embodiment of the present invention have an electron-hole pair generated in the shell which is then funneled into the core, resulting in recombination and emission from the core quantum dot. Preferably emission is substantially from the core of the quantum dot.

Figure 3:
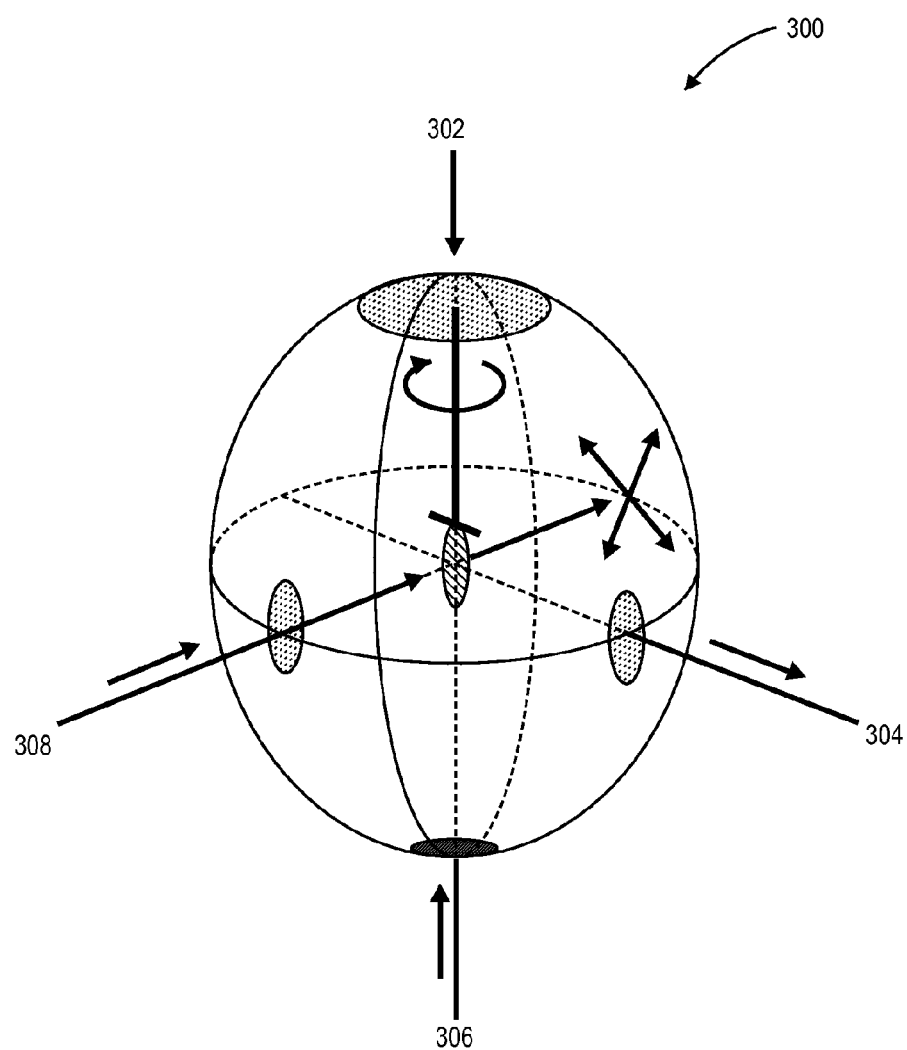
FIG. 3 illustrates a schematic of an integrating sphere for measuring absolute photoluminescence quantum yield, in accordance with an embodiment of the present invention.
Figure 4:
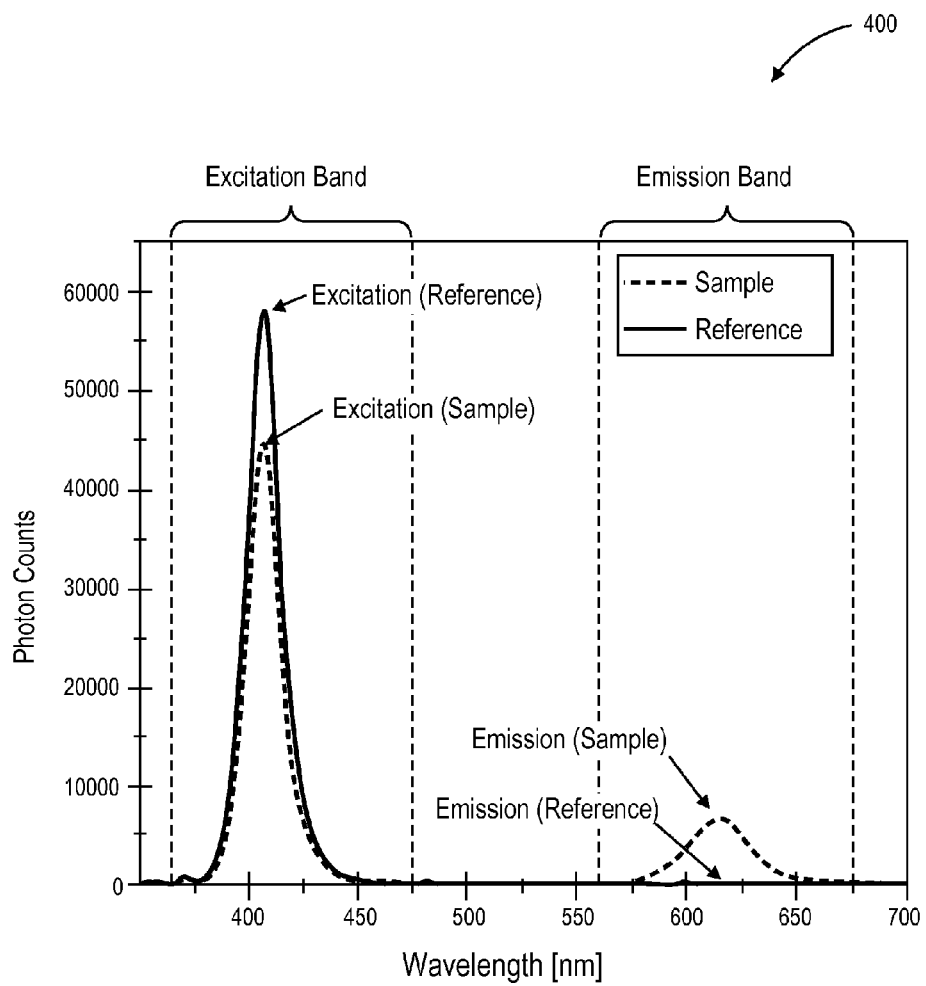
FIG. 4 is a plot of photon counts as a function of wavelength in nanometers for sample and reference emission spectra used in the measurement of photoluminescence quantum yield, in accordance with an embodiment of the present invention.

Measurement of Photoluminescence Quantum Yield (PLQY) may be performed according to the method disclosed in Laurent Porres et al. "Absolute Measurements of Photoluminescence Quantum Yields of Solutions Using an Integrating Sphere", *Journal of Fluorescence* (2006) DOI: 10.1007/s10895-005-0054-8, Springer Science+Business Media, Inc. As an example, FIG. 3 illustrates a schematic of an integrating sphere 300 for measuring absolute photoluminescence quantum yield, in accordance with an embodiment of the present invention. The integrating sphere 300 includes a sample holder 302, a spectrometer 304, a calibrated light source 306 and an ultra-violet (UV) LED 308. FIG. 4 is a plot 400 of photon counts as a function of wavelength in nanometers for sample and reference emission spectra used in the measurement of photoluminescence quantum yield, in accordance with an embodiment of the present invention. Referring to plot 400, both excitation and emission peaks for a sample are calibrated against corresponding excitation and emission peaks for a reference.

In an embodiment, PLQY is measured with a Labsphere™ 6" integrating sphere, a Labsphere™ LPS-100-0105 calibrated white light source, a 3.8 W, 405 nm Thorlabs™ M405L2 UV LED and an Ocean Optics™ USB4000-VIS-NIR spectrometer. The spectrometer and UV LED are coupled into the sphere using Ocean Optics™ UV-Vis optical fibers. The spectrometer fiber is attached to a lens in a port at the side of the sphere at 90 degrees relative to the excitation source. The lens is behind a flat baffle to ensure only diffuse light reaches the lens. The calibrated white light source is affixed to a port in the side of the sphere, at 90° to both the excitation source and the spectrometer port. Custom made sample holders are used to hold solid and solution (cuvette) samples and to rotate samples between direct and indirect measurement positions. Sample holders are coated with a barium sulfate diffuse reflective material. Before measurements are recorded, the calibrated white light source is used to calibrate the spectrometer as a function of wavelength (translating counts per second into relative intensity vs. wavelength). To measure PLQY, a reference sample is inserted into the sphere, and the excitation source LED signal is recorded. This reference sample is generally a blank, such as a cuvette containing a solvent or a sample without quantum dots, so as to only measure the properties of the quantum dots. If it is desirable to measure the properties of the matrix, the blank may be only the substrate. The sample is then inserted into the sphere, in direct beam line for direct measurements, and out of the beam for indirect measurements. The spectrum is recorded and split into excitation and emission bands, each is integrated, and the number of photons emitted per photons absorbed is the photoluminescence quantum yield (PLQY), which is equal to the difference between sample emission and reference emission divided by the difference of reference excitation and sample excitation.

Figure 5:
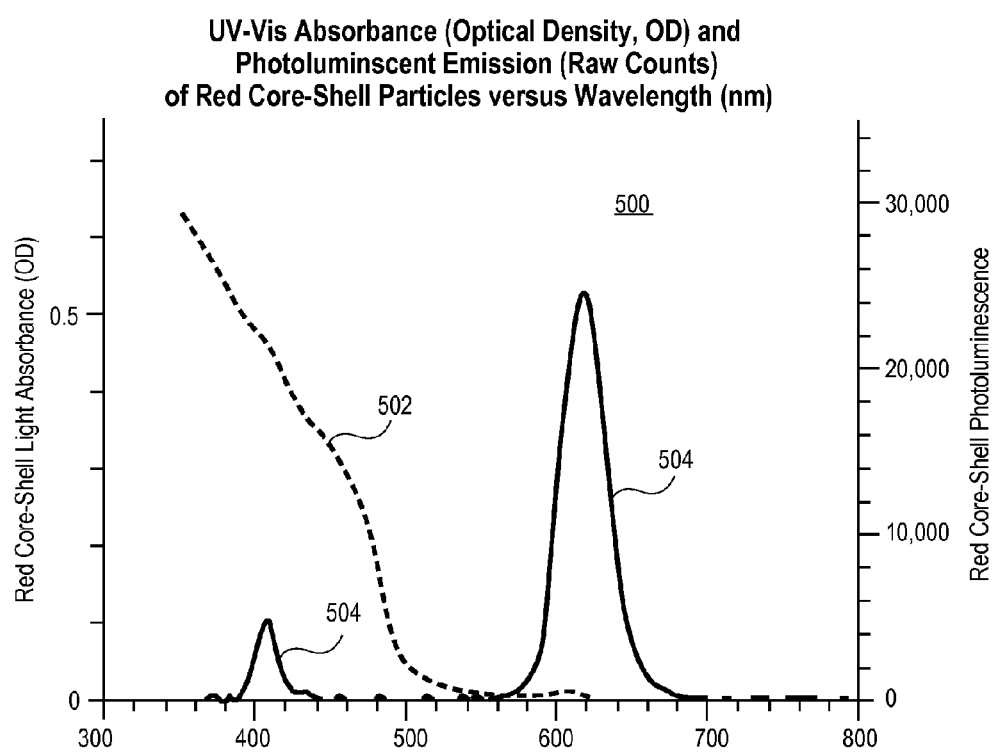
FIG. 5 is a plot including a UV-Vis absorbance spectrum and photoluminescent emission spectrum for red CdSe/CdS core/shell quantum dots, in accordance with an embodiment of the present invention.
Figure 6:
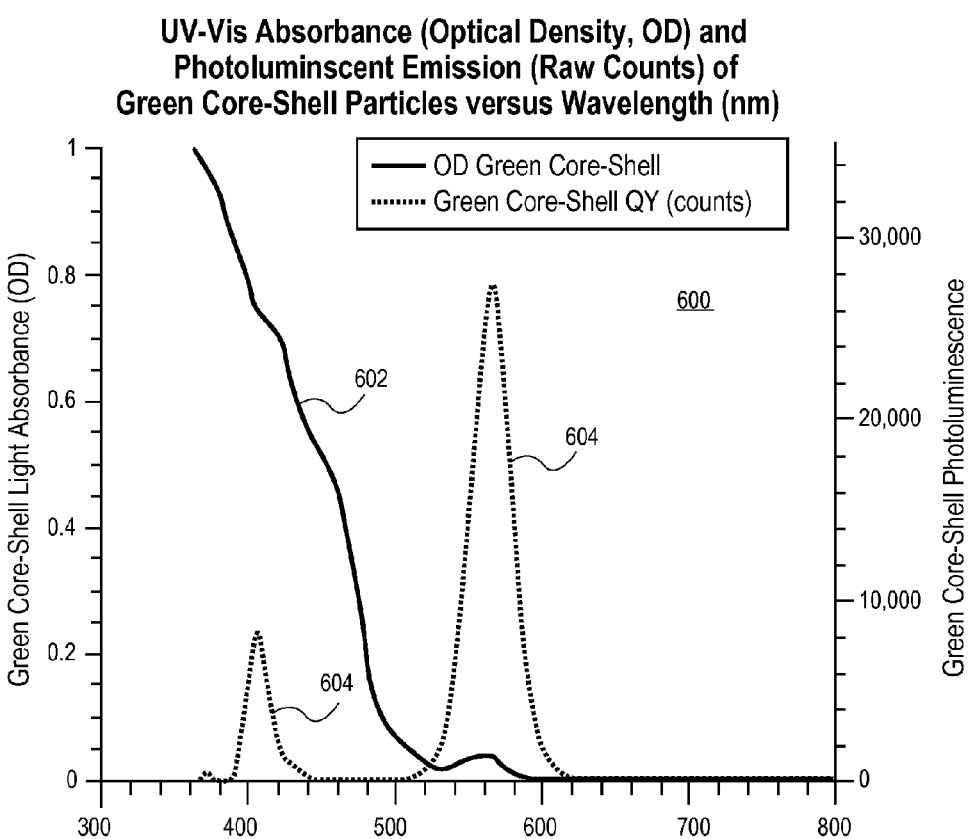
FIG. 6 is a plot including a UV-Vis absorbance spectrum and photoluminescent emission spectrum for a green CdSe/CdS core/shell quantum dot, in accordance with an embodiment of the present invention.

Quantum dots according to embodiments of the present invention have a PLQY between 90-100%, or at least 90%, more preferably at least 91%, more preferably at least 92%, more preferably at least 93%, more preferably at least 94%, more preferably at least 95%, more preferably at least 96%, more preferably at least 97%, more preferably at least 98%, more preferably at least 99% and most preferably 100%. FIG. 5 is a plot 500 including a UV-Vis absorbance spectrum 502 and photoluminescent emission spectrum 504 for red CdSe/CdS core/shell quantum dots, in accordance with an embodiment of the present invention. The quantum dots have essentially no overlapping absorption and emission bands and having an absorbance ratio of about 24. The PLQY was determined to be 94% at 617 nm. The average length (from transmission electron microscopy (TEM) data) is 27 nm±3.3 nm. The average width (from TEM data) is 7.9 nm±1.1 nm. The average aspect ratio (from TEM data) is 3.5±0.6. FIG. 6 is a plot 600 including a UV-Vis absorbance spectrum 602 and photoluminescent emission spectrum 604 for a green CdSe/CdS core/shell quantum dot, in accordance with an embodiment of the present invention. The quantum dot has a small extent of overlapping absorption and emission bands and has an absorbance ratio of 16 (plus or minus one).

In another aspect, semiconductor structures having a nanocrystalline core and corresponding nanocrystalline shell and insulator coating are described. Particularly, coated quantum dots structures and methods of making such structures are described below. In an embodiment, core/shell quantum dots are coated with silica by a method resulting in compositions having photoluminescence quantum yields between 90 and 100%. In one such embodiment, semiconductor structures are coated with silica using a reverse micelle method. A quantum dot may be engineered so that emission is substantially from the core.

Prior art quantum dots may have poor nanocrystal surface and crystalline quality as a result of prior art synthetic techniques not being capable of treating the nanocrystal surface in ways capable of achieving PLQYs above 90 percent. For example, the surface of a nanocrystalline core/shell pairing may have a large number of dangling bonds which act as trap states reducing emission and, therefore, PLQY. Prior art techniques to modify the quantum dot surface include coating quantum dots with silica. However, prior art silica coated quantum dots do not achieve the PLQY necessary for continued use in solid state lighting devices.

In conventional approaches, silica coatings can encapsulate more than one particle (e.g., quantum dot structure) at a time, or the approaches have resulted in incomplete encapsulation. One such conventional approach included coating a quantum dot with silica using self-assembled micelles. The approach requires the presence of a majority of a polar solvent to form a micelle. The requirement is for polar solvent environments to generate the encapsulating micelle, and thus limits the technique to aqueous based applications, such as biological tagging and imaging. Quantum dots with a hydrophobic surfactant or ligand attached are aqueous solution insoluble and thus silica cannot be precipitated with the nanocrystals within the aqueous domains of the micro emulsion. Ligand exchange reactions may be required which then leads to surface quality degradation. However, conventional quantum dot systems often rely on the weak dative Van der Waals bonding of ligands such as phosphonic acids, amines, and carboxylic acids to maintain the structures in solution and protect and passivate the surface of the quantum dot.

The integration of a quantum dot into a product may require protection for chemical compatibility with the solution environment during processing, and ultimately the plastic or gel used for encapsulation. Without such compatibility, particles are likely to aggregate and/or redistribute themselves within the matrix, an unacceptable occurrence in, for example, a solid state lighting product. Protection of the surface and maintenance of an electronically uniform environment also ensures that the density of non-radiative pathways (traps) is minimized, and that the emission energy (color) is as uniform as possible. Furthermore, the surface is protected from further chemical reaction with environmental degradants such as oxygen. This is particularly important for LED applications, where the quantum dot must tolerate temperatures as high as 200 degrees Celsius and constant high-intensity illumination with high-energy light. However, the weak surface bonding of prior art quantum dot ligands are non-ideal for the processing and long-term performance required of an LED product, as they allow degradants access to the quantum dot surface.

In accordance with an embodiment of the present invention, core/shell quantum dots coated with silica and other ligands to provide a structure having a high PLQY. One embodiment exploits a sol-gel process which encapsulates each quantum dot individually in a silica shell, resulting in a very stable high PLQY quantum dot particle. The coated quantum dots disclosed herein may advantageously possess a narrow size distribution for CdSe core stability over time (assessed by PLQY and scattering in solution).

In a general embodiment, a semiconductor structure includes a nanocrystalline core composed of a first semiconductor material. The semiconductor structure also includes a nanocrystalline shell composed of a second, different, semiconductor material at least partially surrounding the nanocrystalline core. An insulator layer encapsulates, e.g., coats, the nanocrystalline shell and nanocrystalline core. Thus, coated semiconductor structures include coated structures such as the quantum dots described above. For example, in an embodiment, the nanocrystalline core is anisotropic, e.g., having an aspect ratio between, but not including, 1.0 and 2.0. In another example, in an embodiment, the nanocrystalline core is anisotropic and is asymmetrically oriented within the nanocrystalline shell. In an embodiment, the nanocrystalline core and the nanocrystalline shell form a quantum dot.

With reference to the above described coated nanocrystalline core and nanocrystalline shell pairings, in an embodiment, the insulator layer is bonded directly to the nanocrystalline shell. In one such embodiment, the insulator layer passivates an outermost surface of the nanocrystalline shell. In another embodiment, the insulator layer provides a barrier for the nanocrystalline shell and nanocrystalline core impermeable to an environment outside of the insulator layer. In any case, the insulator layer may encapsulate only a single nanocrystalline shell/nanocrystalline core pairing. In an embodiment, the semiconductor structure further includes a nanocrystalline outer shell at least partially surrounding the nanocrystalline shell, between the nanocrystalline shell and the insulator layer. The nanocrystalline outer shell is composed of a third semiconductor material different from the semiconductor material of the shell and, possibly, different from the semiconductor material of the core.

With reference again to the above described coated nanocrystalline core and nanocrystalline shell pairings, in an embodiment, the insulator layer is composed of a layer of material such as, but not limited to, silica ($SiO_x$), titanium oxide ($TiO_x$), zirconium oxide ($ZrO_x$), alumina ($AlO_x$), or hafnia ($HfO_x$). In one such embodiment, the layer is a layer of silica having a thickness approximately in the range of 3-30 nanometers. In an embodiment, the insulator layer is an amorphous layer.

With reference again to the above described coated nanocrystalline core and nanocrystalline shell pairings, in an embodiment, an outer surface of the insulator layer is ligand-free. However, in an alternative embodiment, an outer surface of the insulator layer is ligand-functionalized. In one such embodiment, the outer surface of the insulator layer is ligand-functionalized with a ligand such as, but not limited to, a silane having one or more hydrolyzable groups or a functional or non-functional bipodal silane. In another such embodiment, the outer surface of the insulator layer is ligand-functionalized with a ligand such as, but not limited to, mono-, di-, or tri-alkoxysilanes with three, two or one inert or organofunctional substituents of the general formula $(R^1O)_3SiR^2$; $(R^1O)_2SiR^2R^3$; $(R^1O)SiR^2R^3R^4$, where $R^1$ is methyl, ethyl, propyl, isopropyl, or butyl, $R^2$, $R^3$ and $R^4$ are identical or different and are H substituents, alkyls, alkenes, alkynes, aryls, halogeno-derivates, alcohols, (mono, di, tri, poly) ethyleneglycols, (secondary, tertiary, quaternary) amines, diamines, polyamines, azides, isocyanates, acrylates, metacrylates, epoxies, ethers, aldehydes, carboxylates, esters, anhydrides, phosphates, phosphines, mercaptos, thiols, sulfonates, and are linear or cyclic, a silane with the general structure $(R^1O)_3Si-(CH_2)_n-R-(CH_2)_n-Si(RO)_3$ where R and $R^1$ is H or an organic substituent selected from the group consisting of alkyls, alkenes, alkynes, aryls, halogeno-derivates, alcohols, (mono, di, tri, poly) ethylenegly- cols, (secondary, tertiary, quaternary) amines, diamines, polyamines, azides, isocyanates, acrylates, metacrylates, epoxies, ethers, aldehydes, carboxylates, esters, anhydrides, phosphates, phosphines, mercaptos, thiols, sulfonates, and are linear or cyclic, a chlorosilane, or an azasilane. In another such embodiment, the outer surface of the insulator layer is ligand-functionalized with a ligand such as, but not limited to, organic or inorganic compounds with functionality for bonding to a silica surface by chemical or non-chemical interactions such as but not limited to covalent, ionic, H-bonding, or Van der Waals forces. In yet another such embodiment, the outer surface of the insulator layer is ligand-functionalized with a ligand such as, but not limited to, the methoxy and ethoxy silanes $(MeO)_3SiAllyl$, $(MeO)_3SiVinyl$, $(MeO)_2SiMeVinyl$, $(EtO)_3SiVinyl$, $EtOSi(Vinyl)_3$, mono-methoxy silanes, chloro-silanes, or 1,2-bis-(triethoxysilyl)ethane. In any case, in an embodiment, the outer surface of the insulator layer is ligand-functionalized to impart solubility, dispersability, heat stability, photo-stability, or a combination thereof, to the semiconductor structure. For example, in one embodiment, the outer surface of the insulator layer includes OH groups suitable for reaction with an intermediate linker to link small molecules, oligomers, polymers or macromolecules to the outer surface of the insulator layer, the intermediate linker one such as, but not limited to, an epoxide, a carbonyldiimidazole, a cyanuric chloride, or an isocyanate.

With reference again to the above described coated nanocrystalline core and nanocrystalline shell pairings, in an embodiment, the nanocrystalline core has a diameter approximately in the range of 2-5 nanometers. The nanocrystalline shell has a long axis and a short axis, the long axis having a length approximately in the range of 5-40 nanometers, and the short axis having a length approximately in the range of 1-5 nanometers greater than the diameter of the nanocrystalline core. The insulator layer has a thickness approximately in the range of 1-20 nanometers along an axis co-axial with the long axis and has a thickness approximately in the range of 3-30 nanometers along an axis co-axial with the short axis.

A lighting apparatus may include a light emitting diode and a plurality of semiconductor structures which, e.g., act to down convert light absorbed from the light emitting diode. For example, in one embodiment, each semiconductor structure includes a quantum dot having a nanocrystalline core composed of a first semiconductor material and a nanocrystalline shell composed of a second, different, semiconductor material at least partially surrounding the nanocrystalline core. Each quantum dot has a photoluminescence quantum yield (PLQY) of at least 90%. An insulator layer encapsulates each quantum dot.

As described briefly above, an insulator layer may be formed to encapsulate a nanocrystalline shell and anisotropic nanocrystalline core. For example, in an embodiment, a layer of silica is formed using a reverse micelle sol-gel reaction. In one such embodiment, using the reverse micelle sol-gel reaction includes dissolving the nanocrystalline shell/nanocrystalline core pairing in a first non-polar solvent to form a first solution. Subsequently, the first solution is added along with a species such as, but not limited to, 3-aminopropyltrimethoxysilane (APTMS), 3-mercapto-trimethoxysilane, or a silane comprising a phosphonic acid or carboxylic acid functional group, to a second solution having a surfactant dissolved in a second non-polar solvent. Subsequently, ammonium hydroxide and tetraorthosilicate (TEOS) are added to the second solution.

Figure 7:
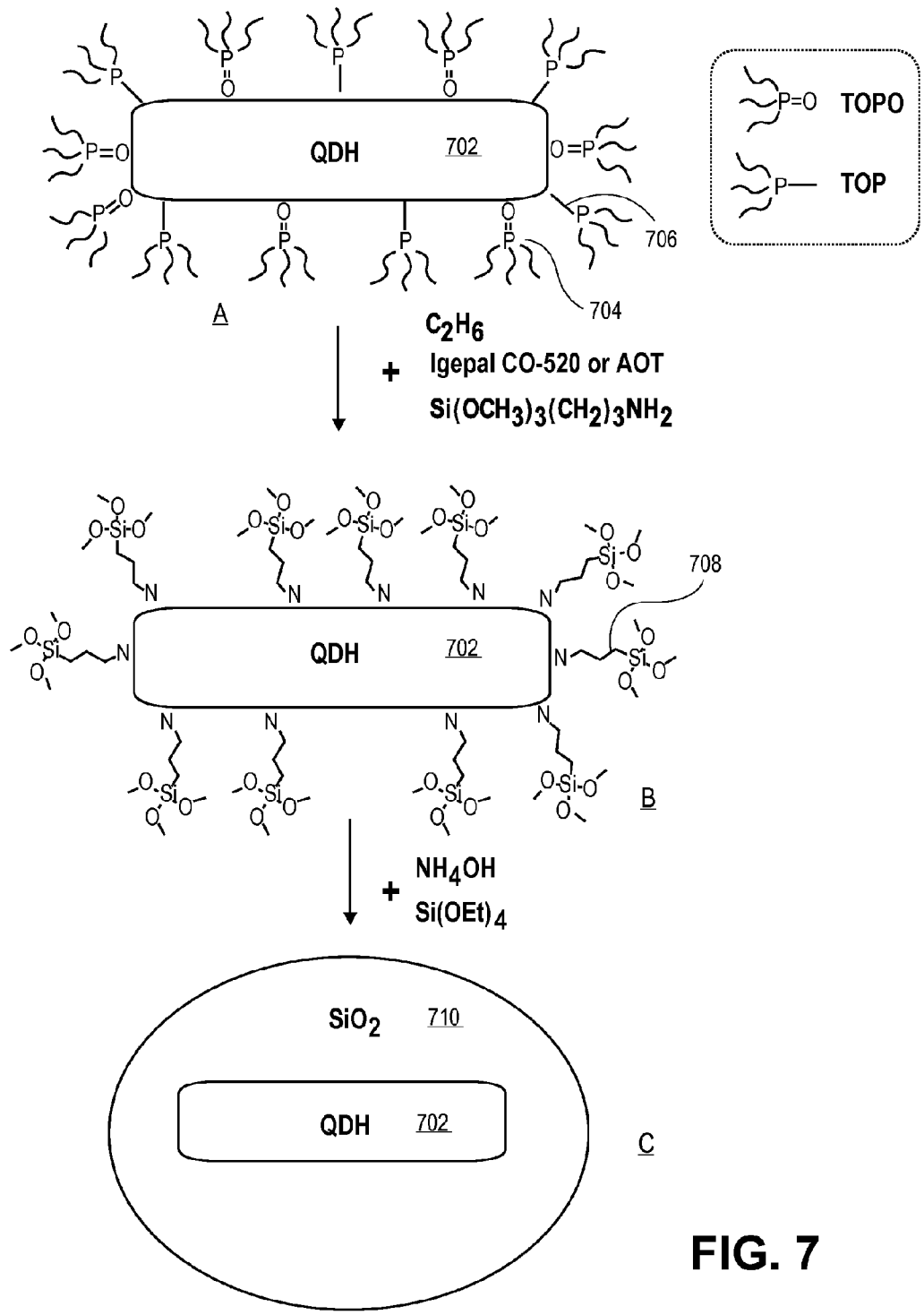
FIG. 7 illustrates operations in a reverse micelle approach to coating a semiconductor structure, in accordance with an embodiment of the present invention.
Figure 8:
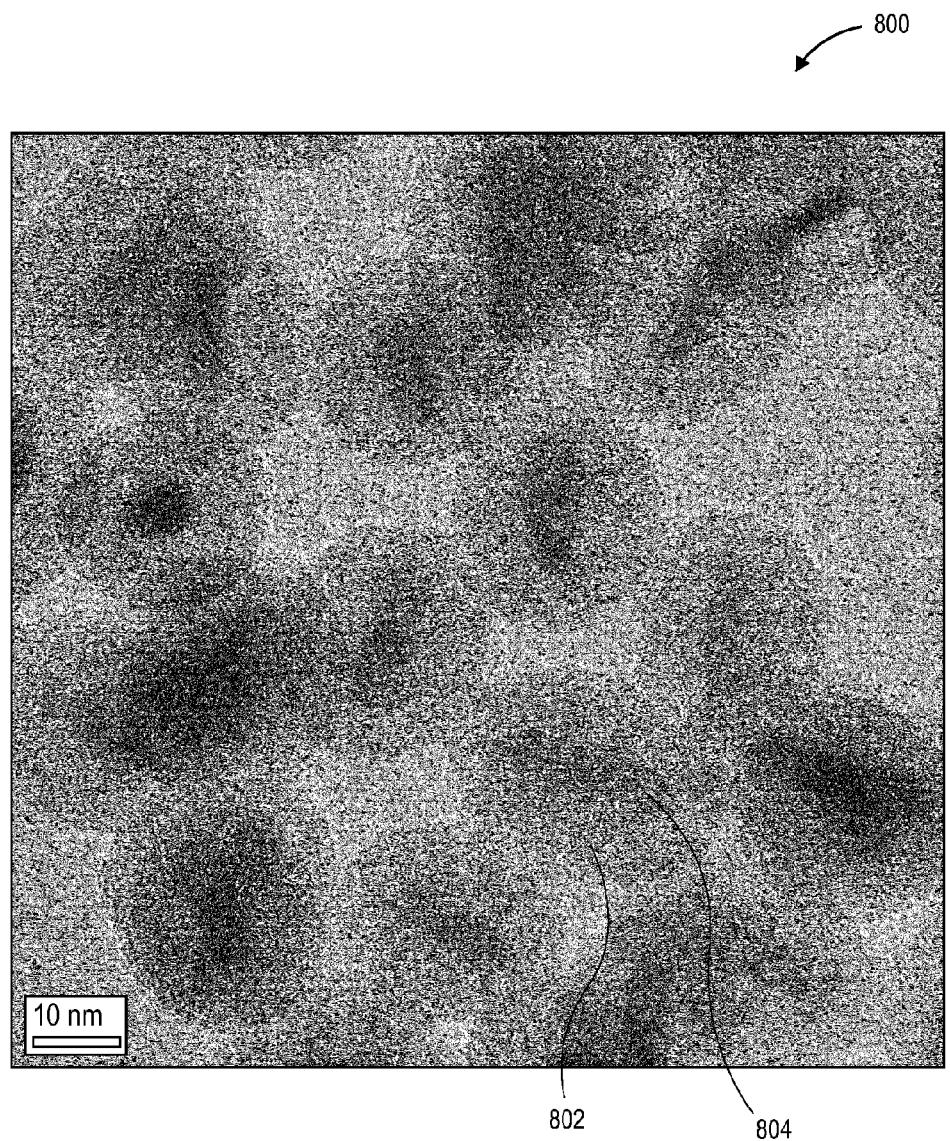
FIG. 8 is a transmission electron microscope (TEM) image of silica coated CdSe/CdS core/shell quantum dots having complete silica encapsulation, in accordance with an embodiment of the present invention.

Thus, semiconductor nanocrystals coated with silica according to the present invention may be made by a sol-gel reaction such as a reverse micelle method. As an example, FIG. 7 illustrates operations in a reverse micelle approach to coating a semiconductor structure, in accordance with an embodiment of the present invention. Referring to part A of FIG. 7, a quantum dot heterostructure (QDH) 702 (e.g., a nanocrystalline core/shell pairing) has attached thereto a plurality of TOPO ligands 704 and TOP ligands 706. Referring to part B, the plurality of TOPO ligands 704 and TOP ligands 706 are exchanged with a plurality of $Si(OCH_3)_3(CH_2)_3NH_2$ ligands 708. The structure of part B is then reacted with TEOS ($Si(OEt)_4$) and ammonium hydroxide ($NH_4OH$) to form a silica coating 710 surrounding the QDH 702, as depicted in part C of FIG. 7. FIG. 8 is a transmission electron microscope (TEM) image 800 of silica coated 802 CdSe/CdS core/shell quantum dots 804 having complete silica encapsulation, in accordance with an embodiment of the present invention. Thus, a reverse micelle is formed after adding ammonium hydroxide and tetraethylorthosilicate (TEOS), the source for the silica coating. TEOS diffuses through the micelle and is hydrolyzed by ammonia to form a uniform $SiO_2$ shell on the surface of the quantum dot. This approach may offer great flexibility to incorporate quantum dots of different sizes. In one such embodiment, the thickness of the insulator layer formed depends on the amount of TEOS added to the second solution.

With reference again to the above described method of forming coated nanocrystalline core and nanocrystalline shell pairings, in an embodiment, the first and second non-polar solvents are cyclohexane. In an embodiment, forming the coating layer includes forming a layer of silica and further includes using a combination of dioctyl sodium sulfosuccinate (AOT) and tetraorthosilicate (TEOS). In another embodiment, however, forming the layer includes forming a layer of silica and further includes using a combination of polyoxyethylene (5) nonylphenylether and tetraorthosilicate (TEOS). In another embodiment, however, forming the layer includes forming a layer of silica and further includes using cationic surfactants such as CTAB (cetyltrimethylammonium bromide), anionic surfactants, non-ionic surfactants, or pluronic surfactants such as Pluronic F 127 (an ethylene oxide/propylene oxide block co-polymer) as well as mixtures of surfactants.

Upon initiation of growth of a silica shell, the final size of that shell may be directly related to the amount of TEOS in the reaction solution. Silica coatings according to embodiments of the present invention may be conformal to the core/shell QDH or non-conformal. A silica coating may be between about 3 nm and 30 nm thick. The silica coating thickness along the c-axis may be as small as about 1 nm or as large as about 20 nm. The silica coating thickness along the a-axis may be between about 3 nm and 30 nm. Once silica shelling is complete, the product is washed with solvent to remove any remaining ligands. The silica coated quantum dots can then be incorporated into a polymer matrix or undergo further surface functionalization. However, silica shells according to embodiments of the present invention may also be functionalized with ligands to impart solubility, dispersability, heat stability and photo-stability in the matrix.

In another aspect, quantum dot composite compositions are described. For example, the quantum dots (including coated quantum dots) described above may be embedded in a matrix material to make a composite using a plastic or other material as the matrix. In an embodiment, composite compositions including matrix materials and silica coated core/shell quantum dots having photoluminescence quantum yields between 90 and 100% are formed. Such quantum dots may be incorporated into a matrix material suitable for down converting in LED applications.

Composites formed by conventional approaches typically suffer from non-uniform dispersion of quantum dots throughout the matrix material which can result in particle agglomeration. Agglomeration may be so severe as to result in emission quenching reducing light output. Another problem is lack of compatibility between the quantum dots and the matrix reduces composite performance. Lack of materials compatibility may introduce a discontinuity at the polymer/quantum dot interface where composite failure may initiate when it is deployed in ordinary use.

Accordingly, there remains a need for a composite material having a quantum dot composition in a matrix that is strong, resistant to thermal degradation, resistant to chemical degradation, provides good adhesion between the coated quantum dot and coupling agent and provides good adhesion between the coupling agent and the polymer matrix. Embodiments described below include quantum dots incorporated into composite matrixes to produce high refractive index films having a high PLQY suitable for solid state device lighting including light emitting diodes.

In an embodiment, an approach for incorporating quantum dots into matrix materials includes coating the quantum dot with a silica shell and reacting the silica shell with a silane coupling agent having two reactive functionalities under the proper conditions. Such an arrangement drives a condensation reaction, binding one end of the silane to the silica surface and leaving the other end of the molecule exposed for integration into a matrix. Other approaches include using a curable material such as metal oxide nanocrystals in a matrix material. In the curable material, metal oxide nanocrystals are linked to a polymer matrix via titanate or a zirconate coupling agents as well as a silane coupling agent, where the metal atoms of the coupling agent link to the oxygen atoms of the metal oxide nanocrystals. Since metal oxides generally do not have a higher refractive index, the curable material incorporating the metal oxide nanocrystals typically can not achieve a refractive index sufficient to improve the light extraction efficiency of photons emitted by an LED in a solid-state device. A high refractive index material including zinc sulfide (ZnS) in a matrix material is another approach attempted. In making the high refractive index material, ZnS colloids are synthesized with ligands having hydroxyl functional groups that are linked to isocyanate function groups present on an oligomer backbone in the matrix material.

In a general embodiment, a composite includes a matrix material. A plurality of semiconductor structures (e.g., quantum dot structures having a coated or non-coated core/shell pairing, such as the structures described above) is embedded in the matrix material. In an embodiment, a lighting apparatus includes a light emitting diode and a composite coating the light emitting diode. The composite may be formed by embedding quantum dots in a matrix material described below.

Figure 9A:
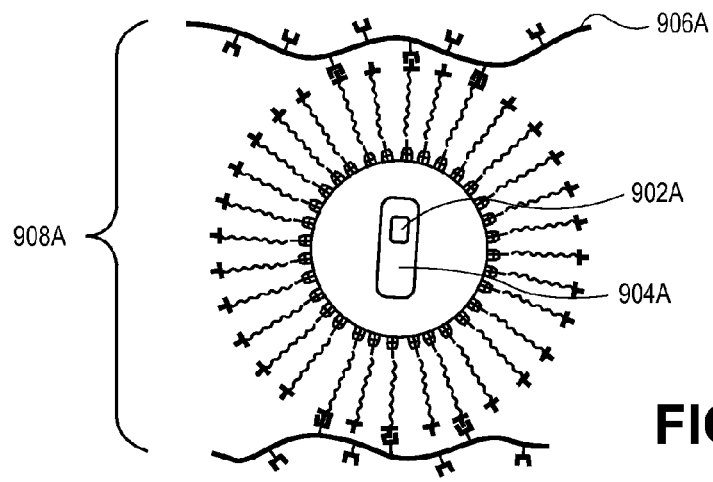
FIGS. 9A-9C illustrate schematic representations of possible composite compositions for quantum dot integration, in accordance with an embodiment of the present invention.
Figure 9B:
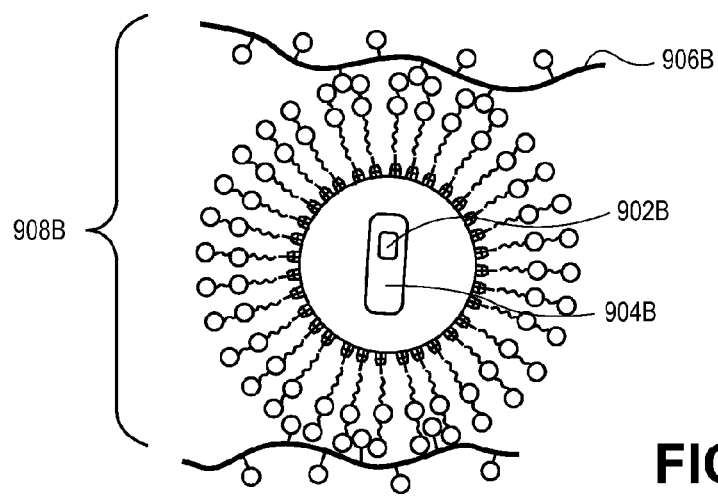
Figure 9C:
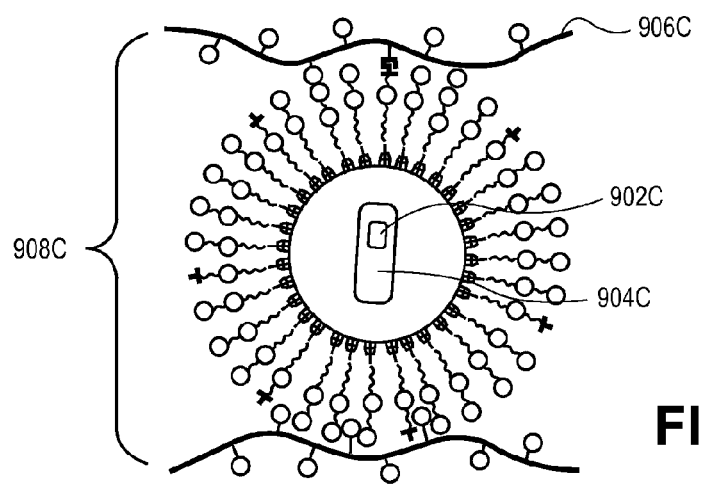

With reference to the above described composite, in an embodiment, each of the plurality of semiconductor structures is cross-linked with, polarity bound by, or tethered to the matrix material. In an embodiment, each of the plurality of semiconductor structures is bound to the matrix material by a covalent, dative, or ionic bond. By way of example, FIGS. 9A-9C illustrate schematic representations of possible composite compositions for quantum dot integration, in accordance with an embodiment of the present invention. Referring to FIG. 9A, a nanocrystalline core 902A and shell 904A pairing is incorporated into a polymer matrix 906A by active cross-linking through multiple and interchain binding to form a cross-linked composition 908A. Referring to FIG. 9B, a nanocrystalline core 902B and shell 904B pairing is incorporated into a polymer matrix 906B by polarity-based chemical similarity and dissolution to form a polarity based composition 908B. Referring to FIG. 9C, a nanocrystalline core 902C and shell 904C pairing is incorporated into a polymer matrix 906C by reactive tethering by sparse binding and chemical similarity to form a reactive tethering based composition 908C.

With reference again to the above described composite, in an embodiment, one or more of the semiconductor structures further includes a coupling agent covalently bonded to an outer surface of the insulator layer. For example, in one such embodiment, the insulator layer includes or is a layer of silica ($SiO_x$), and the coupling agent is a silane coupling agent, e.g., having the formula $X_nSiY_{4-n}$, where X is a functional group capable of bonding with the matrix material and is one such as, but not limited to, hydroxyl, alkoxy, isocyanate, carboxyl, epoxy, amine, urea, vinyl, amide, aminoplast and silane, Y is a functional group such as, but not limited to, hydroxyl, phenoxy, alkoxy, hydroxyl ether, silane or aminoplast, and n is 1, 2 or 3. In another embodiment, however, the coupling agent is one such as, but not limited to, a titanate coupling agent or a zirconate coupling agent. It is to be understood that the terms capping agent, capping ligand, ligand and coupling agent may be used interchangeably as described above and, generally, may include an atom, molecule or other chemical entity or moiety attached to or capable of being attached to a nanoparticle. Attachment may be by dative bonding, covalent bonding, ionic bonding, Van der Waals forces or other force or bond.

In the case that a silica surface of a silica coated quantum dot is modified using silane coupling agents having multiple functional moieties, coupling to the surface of the silica shell and coupling to a matrix material and/or other matrix additives may be enabled. Such an approach provides uniform dispersion throughout the composite matrix using as little effort (e.g., reaction energy) as possible. Stronger physical and/or chemical bonding between the silica coated quantum dots and the matrix resin occurs. Also, the silane coupling composition must be compatible with both the silica coated quantum dot, which is inorganic, and the polymer matrix, which may be organic. Without being bound by any particular theory or principle, it is believed that the silane coupling agent forms a bridge between the silica and the matrix resin when reactive functional groups on the silane coupling agent interact with functional groups on the surface of the silica and/or the matrix resin. Because the functional groups involved are typically polar in nature, the coupling agent tends to be hydrophilic and readily dispersed in an aqueous size composition.

Matrix materials suitable for embodiments of the present invention may satisfy the following criteria: they may be optically clear having transmission in the 400-700 nm range of greater than 90%, as measured in a UV-Vis spectrometer. They may have a high refractive index between about 1.0 and 2.0, preferably above 1.4 in the 400-700 nm range. They may have good adhesion to an LED surface if required and/or are sufficiently rigid for self-supporting applications. They may able to maintain their properties over a large temperature range, for example −40° C. to 150° C. and over a long period of time (over 50,000 hours at a light intensity typically 1-10 w/cm2 of 450 nm blue light).

Thus, with reference again to the above described composite, in an embodiment, the insulator layer is composed of a layer of silica ($SiO_x$), and the matrix material is composed of a siloxane copolymer. In another embodiment, the matrix material has a UV-Vis spectroscopy transmission of greater than 90% for light in the range of 400-700 nanometers. In an embodiment, the matrix material has a refractive index approximately in the range of 1-2 for light in the range of 400-700 nanometers. In an embodiment, the matrix material is thermally stable in a temperature range of −40-250 degrees Celsius. In an embodiment, the matrix material is composed of a polymer such as, but not limited to, polypropylene, polyethylene, polyesters, polyacetals, polyamides, polyacrylamides, polyimides, polyethers, polyvinylethers, polystyrenes, polyoxides, polycarbonates, polysiloxanes, polysulfones, polyanhydrides, polyamines, epoxies, polyacrylics, polyvinylesters, polyurethane, maleic resins, urea resins, melamine resins, phenol resins, furan resins, polymer blends, polymer alloys, or mixtures thereof. In one such embodiment, the matrix material is composed of a polysiloxane such as, but not limited to, polydimethylsiloxane (PDMS), polymethylphenylsiloxane, polydiphenylsiloxane and polydiethylsiloxane. In an embodiment, the matrix material is composed of a siloxane such as, but not limited to, dimethylsiloxane or methylhydrogen siloxane.

Additionally, with reference again to the above described composite, in an embodiment, the plurality of semiconductor structures is embedded homogeneously in the matrix material. In an embodiment, the composite further includes a compounding agent embedded in the matrix material. The compounding agent is one such as, but not limited to, an antioxidant, a pigment, a dye, an antistatic agent, a filler, a flame retardant, an ultra-violet (UV) stabilizer, or an impact modifier. In another embodiment, the composite further includes a catalyst embedded in the matrix material, the catalyst one such as, but not limited to, a thiol catalyst or a platinum (Pt) catalyst.

Accordingly, in an embodiment, a method of fabrication includes forming a plurality of semiconductor structures embedded in a matrix material (or embedding preformed semiconductor structures in a matrix material). In one such embodiment, embedding the plurality of semiconductor structures in the matrix material includes cross-linking, reactive tethering, or ionic bonding the plurality of semiconductor structures with the matrix material. In an embodiment, the method further includes surface-functionalizing an insulator layer for the semiconductor structures prior to embedding the plurality of semiconductor structures in the matrix material. In one such embodiment, the surface-functionalizing includes treating the insulator layer with a silane coupling agent. However, in an alternative embodiment, coated semiconductor structures are embedded in a matrix by using a ligand-free insulator layer.

In another embodiment, simple substitution at the surface of the silica coated quantum dots is effective for stable integration without undesired additional viscosity and is suitable to produce a low-viscosity product such as a silicone gel. In one embodiment of the present invention a composite incorporates quantum dots which crosslink with the matrix through silane groups and which possess an adequate number of silane groups in order to form an elastic network. In addition, adequate adhesion to various substrates is enabled. Furthermore, silicone-based matrixes may be used. A structure of such polymers may be obtained which form microstructures in the crosslinked composition, thereby yielding cross-linked polymer compounds with an excellent mechanical strength. Furthermore, because of the distribution of the reactive silane groups, a high elasticity may be obtained after cross-linking.

EXEMPLARY SYNTHETIC PROCEDURES

Example 1

Synthesis of CdSe core nanocrystals. 0.560 g (560 mg) of ODPA solid was added to a 3-neck 25 ml round-bottom flask and 6 g TOPO solid was added to the flask. 0.120 g (120 mg) of CdO solid was added to the flask. With the flask sealed and the reagents inside (CdO, ODPA, TOPO), heat the reaction to 120° C. under flowing UHP Argon gas. When the reaction mixture becomes liquid, begin stirring at 800 RPM to completely distribute the CdO and ODPA. When the temperature equilibrates at around 120° C., begin degassing the reaction mixture: Standard degas is for 30 minutes at as low a vacuum as the system can maintain, preferably between 10-30 torr. After the first degas, switch the reaction back to flowing UHP Argon gas. The temperature of the reaction was raised to 280° C. to dissociate the CdO. Dissociation is accompanied by a loss of the typical red color for CdO. After dissociation of the CdO, cool the reaction to 120° C. for the 2nd degassing step. Preferably this step is done slowly. In one embodiment this is done in increments of 40 degrees and allowed to equilibrate at each step. When the reaction mixture has cooled to about 120° C., begin the second degassing step. The second degassing is typically 1 hour at the lowest vacuum level possible. After the second degassing, switch the reaction back to flowing UHP Argon. Heat the reaction mixture. Inject 3.0 g TOP into the reaction solution as temperature increases above 280° C. Equilibrate the reaction solution at 370° C. When the reaction is equilibrated at 370° C., inject 0.836 g of 14% Se:TOP stock solution into the solution. The reaction is run until the desired visible emission from the core is achieved. For CdSe cores the time is usually between 0.5 and 10 minutes. To stop the reaction: while continuing to stir and flow UHP Argon through the reaction, rapidly cool the solution by blowing nitrogen on the outside of the flask. When the reaction temperature is around 80° C., expose the reaction solution to air and inject approximately 6 mL of toluene. Precipitate the CdSe nanocrystals through the addition of 2-propanol (IPA) to the reaction solutions. Preferably the mixture should be approximately 50/50 (by volume) reaction solution/IPA to achieve the desired precipitation. Centrifuge for 5 minutes at 6000 RPM. Redissolve the CdSe in as little toluene as possible solid (<2 mL). Precipitate the CdSe again using IPA. Centrifuge. Decant the supernatant liquid. Dissolve the CdSe solid in anhydrous toluene.

Example 2

Synthesis of CdSe/CdS core-shell nanocrystal heterostructures having PLQY>90%. Transfer 0.290 g (290 mg) of ODPA into a round bottom flask. Transfer 0.080 g (80 mg) of hexylphosphonic acid (HPA) into the flask. Transfer 3 g TOPO into the flask. Transfer 0.090 g (90 mg) of CdO solid into the reaction flask. With the flask sealed and the reagents inside (CdO, ODPA, TOPO, HPA), heat the reaction to 120° C. under flowing UHP Argon gas. When the reaction mixture becomes liquid, at about 60° C., begin stirring at 800 RPM to completely distribute the CdO, ODPA, and HPA. When the temperature settles at 120° C., begin degassing the reaction mixture. After the degas step, switch the reaction back to flowing UHP Argon gas. Raise the temperature of the reaction to 280° C. to dissociate the CdO. Increase the temperature set-point of the reaction to 320° C. Inject 1.5 g TOP into the reaction solution as temperature increases above 280° C. When the reaction is equilibrated at 320° C., inject a mixture of 1.447 g of 7.4% S:TOP stock solution and 0.235 g concentration-adjusted CdSe seed stock into the reaction solution. Immediately reduce the set point of the temperature controller to 300° C. Allow the reaction to proceed for the requisite time to necessary to produce the desired length and width of shell, yielding a rod having an aspect ratio as between 1.5 and 10, more preferably between 3 and 6. Reaction temperature for shell growth is between 120° C. and 380° C., preferably between 260° C. and 320° C., more preferably between 290° C. and 300° C.

The reaction is monitored by testing a sample to determine the absorbance at 400 nm and the at the CdSe exciton peak. Most preferably the reaction is stopped when the absorbance at 400 nm divided by the absorbance at the CdSe exciton peak is between about 25-30, but the invention contemplates that the absorbance ratio may be between about 6 and about 100, preferably between about 15-35. By "stopping the growth" it is meant that any method steps may be employed known in the art if desired and available to cease the growth of the shell. Some methods will lead to quicker cessation of shell growth than others.

Absorbance measuring may be performed by UV-VIS spectroscopic analytical method, such as a method including flow injection analysis for continuous monitoring of the reaction. In an embodiment, the reaction is stopped or arrested by removing a heating mantle and allowing the reaction vessel to cool. When the reaction temperature is around approximately 80 degrees Celsius, the reaction solution is exposed to air and approximately 4-6 mL of toluene is injected. The quantum dots are purified by transferring the reaction solution into four small centrifuge tubes, so that an equal volume is in each tube. The QDH product is precipitated through the addition of 2-propanol (IPA) to the reaction solutions. Following centrifuging, the supernatant liquid is decanted. The QDH is redissolved in as little toluene as possible (e.g., less than approximately 2 mL) and re-concentrated into one centrifuge tube. The precipitation and centrifugation steps are repeated. The final solid product is then dissolved in approximately 2 g of toluene.

Example 3

Figure 10:
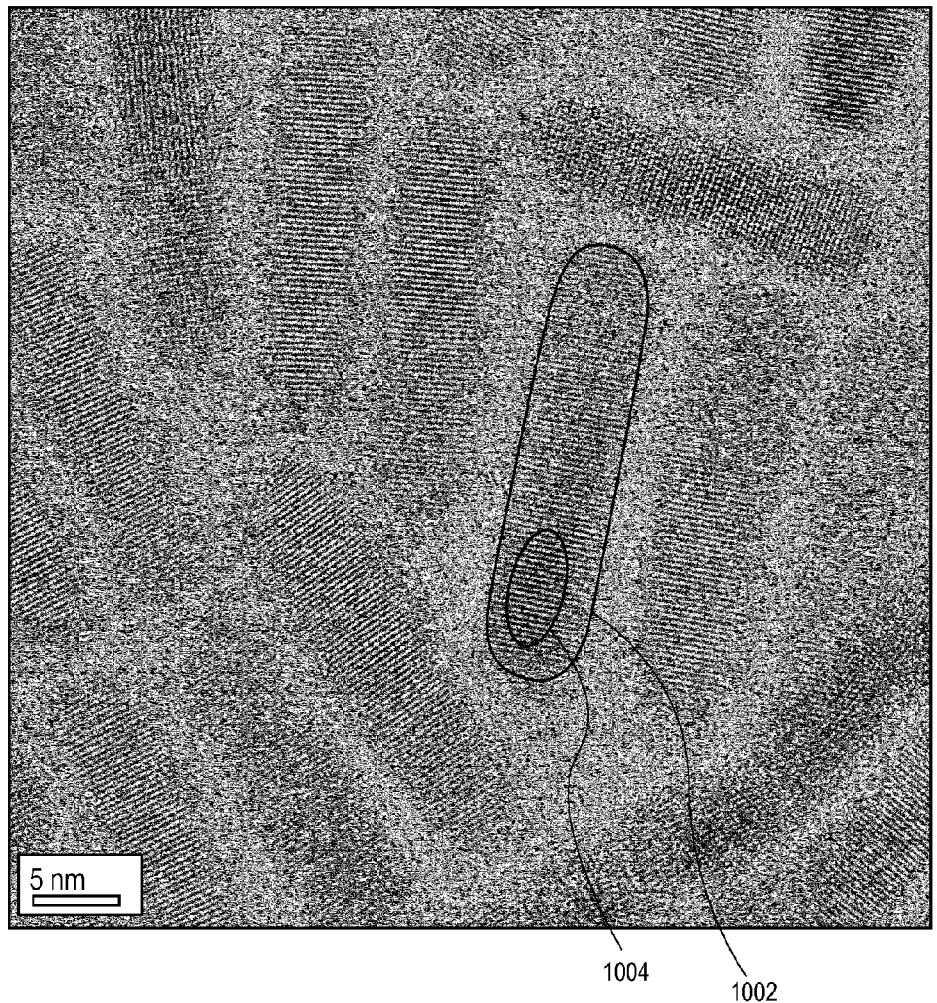
FIG. 10 is a transmission electron microscope (TEM) image of a sample of core/shell CdSe/CdS quantum dots, in accordance with an embodiment of the present invention.

Synthesis of CdSe/CdS quantum dot having an absorbance ratio between 6-100. A quantum dot was fabricated according to Example 2 and having an absorbance ratio between 6-100. FIG. 10 is a transmission electron microscope (TEM) image 1000 of a sample of core/shell (1002/1004) CdSe/CdS quantum dots, in accordance with an embodiment of the present invention. The TEM image 1000 indicates that there are substantially no structural defects as can be deduced from the low density of stacking faults and lack of other visible defects along the semiconductor structure 1002/1004.

Example 4

Figure 11:
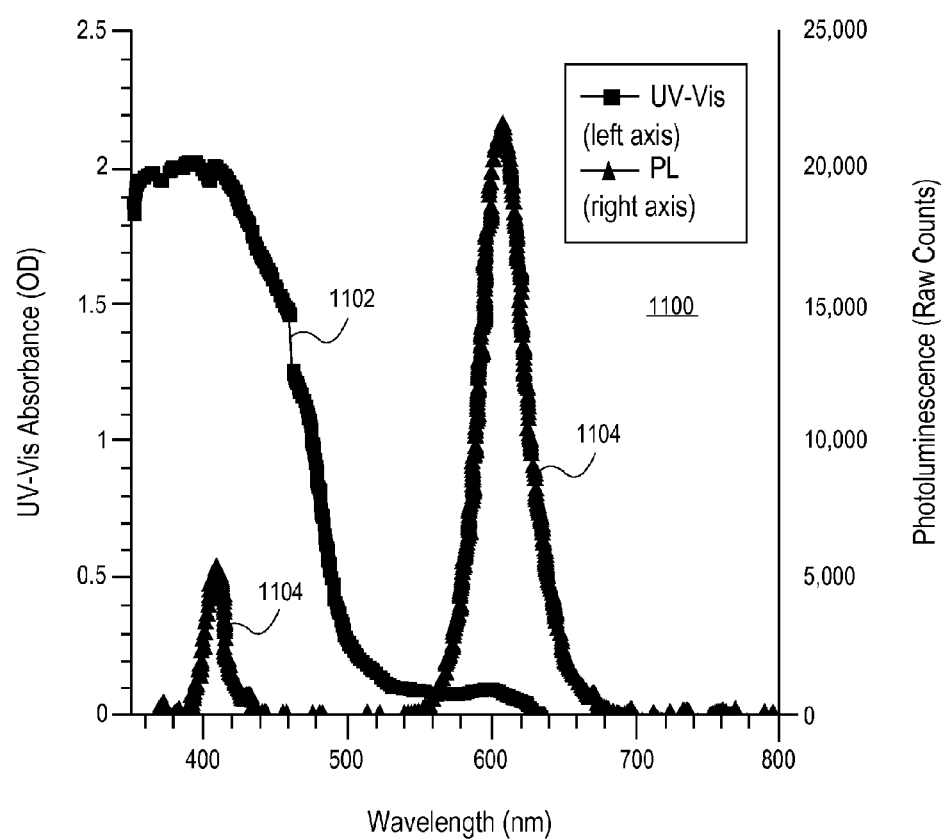
FIG. 11 is a plot including a UV-Vis absorbance spectrum and photoluminescent emission spectrum for a CdSe/CdS core/shell quantum dot having a PLQY of 96%, in accordance with an embodiment of the present invention.
Figure 12:
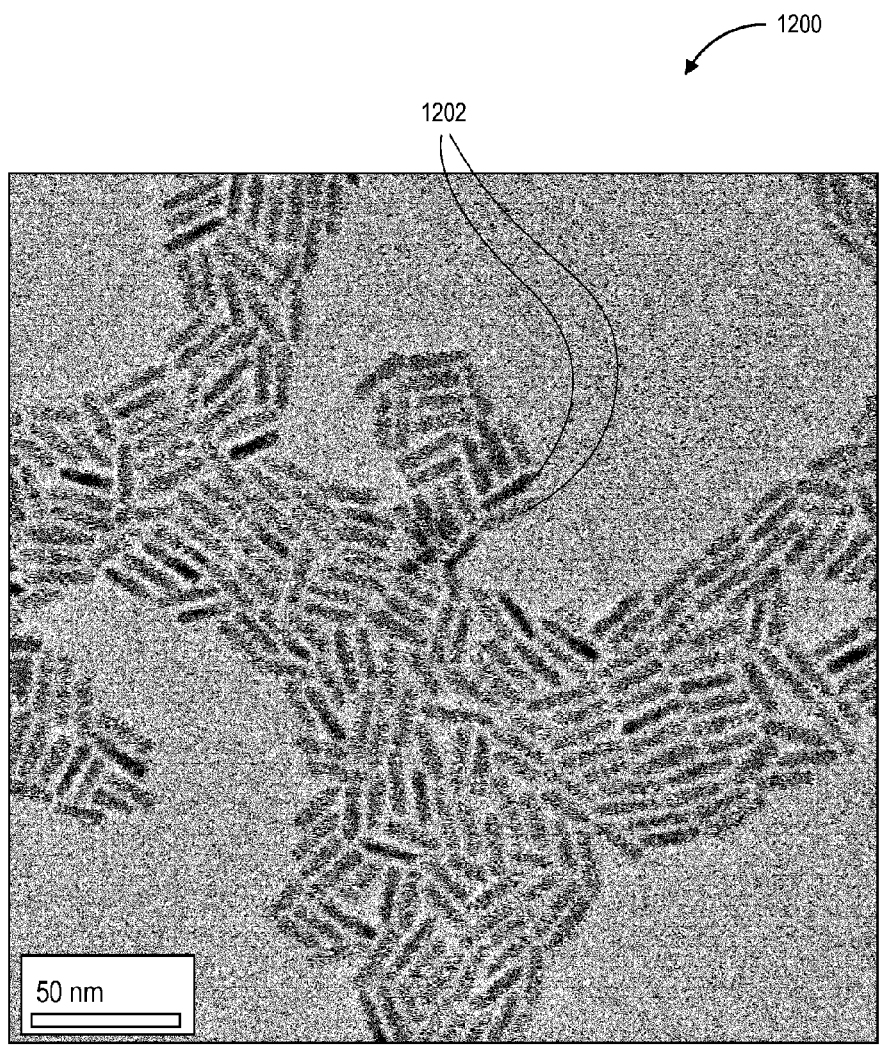
FIG. 12 is a transmission electron microscope (TEM) image of a sample of CdSe/CdS quantum dots having a PLQY of 96%, in accordance with an embodiment of the present invention.

Synthesis of CdSe/CdS red quantum dot with a PLQY=96%. Quantum dots were fabricated according to Example 2 and having an absorbance ratio between 6-100, and having a PLQY of 96% at 606 nm. The average length (from TEM data) is 22.3 nm±3.1 nm. The average width (from TEM data) is 6.0 nm±0.6 nm. The average aspect ratio (from TEM data) is 3.8±0.6. FIG. 11 is a plot 1100 including a UV-Vis absorbance spectrum 1102 and photoluminescent emission spectrum 1104 for a CdSe/CdS core/shell quantum dot having a PLQY of 96%, in accordance with an embodiment of the present invention. The quantum dot has essentially no overlapping absorption and emission bands. FIG. 12 is a transmission electron microscope (TEM) image 1200 of a sample of CdSe/CdS quantum dots 1202 fabricated according to example 4, in accordance with an embodiment of the present invention.

Example 5

Reactive Ligand Exchange for quantum dot structures. 0.235 g of concentration-adjusted CdSe stock from Example 2 are exposed to a reactive exchange chemical, trimethylsilylpyrollidine (TMS-Pyr), for 20 minutes in an air-free environment and are mixed completely. After 20 minutes, an alcohol, usually 2-propanol or methanol is added to the mixture to quench the reactivity of the TMS-Pyr reagent, and to precipitate the reactively exchanged CdSe particles. The precipitated particles are centrifuged at 6000 RPM for 5 minutes. The resulting supernatant liquid is decanted and the precipitate are re-dissolved in 0.235 g of anhydrous toluene for use in the procedure described in Example 2. Reactive ligand exchange is used to introduce any number of desired surface functionalities to the surface of quantum dot cores prior to rod growth or the surface of the core/shell particles after synthesis.

Example 6

Coating semiconductor nanocrystalline core/shell pairing with silica using dioctyl sodium sulfosuccinate (AOT). Approximately 4.5 g of AOT is dissolved in 50 mL of cyclohexane. 0.5 g of QDH is precipitated w/methanol, and then re-dissolved in hexane. 20 µL of 3-aminopropyltrimethoxysilane (APTMS) is added and stirred for 30 minutes. 900 µL of NH4OH (29 wt %) is added into the solution immediately followed by 600 µL of TEOS. The solution is stirred for about 16 hrs which allows the mixture to react until a silica shell coats the nanocrystal. The silica coated particles are precipitated by MeOH and the precipitated particles are separated from the supernatant using a centrifuge. The $SiO_2$ coated particles can be re-dispersed in toluene or left in cyclohexane.

Example 7

Coating a semiconductor nanocrystal with silica using IGEPAL CO-520. Approximately 4.46 g of Igepal CO-520 (Polyoxyethylene (5) nonylphenylether) is dissolved in 50 mL of cyclohexane and allowed to mix. "n" may be 3, 4, 5, 6, 7, 8, 9 or 10, preferably about 5. 0.5 grams of quantum dots dissolved in toluene are added. 20 µL of 3-APTMS is added and stirred for about 30 minutes. 900 µL of $NH_4OH$ (29 wt %) is added into the solution immediately followed by 600 µL of TEOS. The solution is stirred for about 16 hrs at 1600 rpm which allows the mixture to react until a silica shell coats the nanocrystal. The micelles are broken up by IPA and collected using a centrifuge. The $SiO_2$ coated particles may be re-dispersed in toluene or left in cyclohexane for polymer integration.

Example 8

Methoxy silane coupling agent. Silica-shelled core-shell quantum dots are dispersed in 20 parts toluene to 1 part (MeO)3SiR (R=allyl or vinyl), and constantly stirred to allow the coupling reaction to take place. The functionalized particles are separated and cleaned by precipitation with IPA and centrifugation at 6000 rpm for 10 min. The process is repeated two or more times. Cleaned particles are dispersed in a known amount of toluene or polymer solution.

Example 9

Quantum dot/polymer preparation. To prepare the films, a known mass of quantum dots in toluene or cyclohexane is added to premade polymer solution, depending on solvent compatibility of the polymer matrix used. Other solvents may also be used for dissolution, if so desired for polarity match with the matrix or to increase or decrease the viscosity or rate of solvent evolution from the cast film.

Example 10

Film casting. The composite compositions are prepared by drop casting approximately 360 µL of QDH polymer solution onto a 12 mm glass round. The amount of quantum dots added to the polymer solution can be adjusted for different optical densities in the final QDH film. After casting films, the slow evaporation of solvent is important to give a film free of large surface imperfections. QDH-polymer solutions in toluene are allowed to evaporate in a vented fume hood. The films are cast on a level stainless plate. Once films are dried they are analyzed for PLQY and UV-Vis properties.

Example 11

The surface of silica-shelled quantum dot was functionalized using a variety of methoxy and ethoxy silanes: $(MeO)_3SiAllyl$, $(MeO)_3SiVinyl$, $(MeO)_2SiMeVinyl$, $(EtO)_3SiVinyl$, $EtOSi(Vinyl)_3$. The functionalized silica-shelled quantum dot was then used in the standard polymer formulation with additives for crosslinking, as well as without any further crosslinking co-agents such as TAIC in the case of EVA or divinylsilanes for siloxanes.

Example 12

In one embodiment, it is preferred that the olefin group is able to participate in a crosslinking process through radical mechanism in the case of EVA or through hydrosilylation process in the case of siloxanes. Allyl and vinyl are preferred, but other olefins can be included.

Example 13

In one embodiment, the degree of crosslinking may be increased using quantum dots with a higher density of the olefin groups on silica surface of quantum dots.

Example 14

Using polarity. The surface of a silica-shelled particle is modified with organo-substituted silanes in order to maximize the compatibility with a polymer matrix such as the polysiloxanes for LEDs. The silica surface is modified with organo-substituted silanes, and its properties are therefore modified by the grafted functional groups.

Example 15

Pt catalyst. A platinum-based catalyst may be introduced in Examples 9-14. In addition to the functionalized silica particles, two competing or complementary catalysts are available for cross-linking.

Example 16

Thiol catalyst. The Pt catalyst of example 15 is replaced with a thiol catalyst with a thiol-ene reaction. Di-thiols or multifunctional thiols are used. The approach enables UV curing in place of heat curing.

The above described semiconductor structures, e.g., quantum dots, may be fabricated to further include one or more compositional transition layers between portions of the structures, e.g., between core and shell portions. Inclusion of such a transition layer may reduce or eliminate any performance inefficiency associated with otherwise abrupt junctions between the different portions of the structures. For example, the inclusion of a compositional transition layer may be used to suppress Auger recombination within a quantum dot structure. Auger recombination events translate to energy from one exciton being non-radiatively transferred to another charge carrier. Such recombination in quantum dots typically occurs on sub-nanosecond time scales such that a very short multi-exciton lifetime indicates non-radiative recombination, while higher nanosecond bi-exciton lifetimes indicate radiative recombination. A radiative bi-exciton has a lifetime approximately 2-4 times shorter than radiative single exciton.

Temperature performance can be highly dependent on semiconductor surface preparation, indicating that accessibility of surface states may be responsible for high temperature behavior. Light-induced intermittency is a feature of quantum dots which is believed to lead to poor performance at high flux intensities. The phenomenon is relatively temperature independent, which leads to a surface state insensitive model for the behavior. Instead, it appears to be controlled primarily by the composition and nature of the internal particle interfaces.

Accordingly, in an embodiment, a quantum dot architecture is fabricated to include one or more of a graded composition, multiple layers, and asymmetry to control exciton dynamics. Such tailoring of the quantum dot architecture may be performed to provide optimum photoluminescent (PL) quantum yield performance at high temperatures (e.g., up to approximately 200 degrees Celsius) and high incident flux intensities (e.g., up to approximately 150 W/cm$^2$). As a benchmark, a variety of architectures for quantum dots have been shown to provide very high quantum yields (e.g., 80% or higher) at room temperatures, but often exhibit temperature droop and photobleaching at high temperatures and high fluxes. One or more embodiments of the present invention are directed to the fabrication of quantum dots having compositions and architectures suitable to address the above described structural issues which have been known to cause temperature droop and photobleaching.

More specifically, as is described in greater detail below in association with FIGS. 13-15, an optimal particle (e.g., quantum dot structure) may have one or more of a high aspect ratio, a large volume relative to other quantum dot heterostructures, and graded or alloyed transitions between different semiconductor materials. The graded or alloyed transitions can be used to render a compositional and structural transition from one component (such as a quantum dot core) to another component (such as a quantum dot shell) a smooth function rather than a step function. In one embodiment, the terms "graded," "gradient," or "grading" are used to convey gradual transitioning from one semiconductor to another. In one embodiment, the terms "alloy," "alloyed," or "alloying" are used to convey an entire volume having a fixed intermediate composition. In more specific embodiments, core or seed volume is maximized relative to shell volume for a given emission color. A graded or alloyed core/shell transition layer may be included between the two volumes.

Furthermore, temperature droop may be attributed to surface states which are made more accessible to an excited state at high temperatures. In an embodiment, temperature droop is mitigated or eliminated by using large, crystalline volume in addition to a large bandgap crystalline coating over the core and an amorphous outer coating applied to the resulting to the particle. In an embodiment, photo-bleaching is mitigated or eliminated by alloying or grading a well-pas sivated particle at transitions between semiconductor layers. Alloying or grading the transition between different semiconductors may provide certainty for momentum of the carriers, reducing non-radiative excited state relaxation processes.

Past approaches to addressing quantum dot inefficiencies have included the use of spherical alloyed particles which demonstrate good photobleaching characteristics, but with starting PLQYs in the 40% range. Such systems provide reasonable behavior at high intensity but with emission efficiencies that may be too low to be useful in a device such as a lighting device. Furthermore, past approaches have not effectively addressed both photo-bleaching and temperature droop in a same particle.

In an exemplary embodiment, a quantum dot is fabricated to include core semiconductor nanoparticle is fabricated to have an aspect ratio between 1 and 2, a graded transition of ½ to 2 monolayers between core and shell, a rod-shaped shell with a high aspect ratio (e.g., between 4 and 6), a graded transition of ½ to 2 monolayers between first and second semiconductor shell materials, a final intrinsic layer of the second semiconductor shell material, and an outer coating of amorphous insulator, such as $SiO_2$. Such quantum dots exhibit very high PLQYs preserved both at room temperature and under conditions of high temperature and high flux for long periods of time. More generally, such quantum dots may provide optimal temperature stability and high temperature performance by stabilizing a seed/rod structure with a coating of amorphous wide bandgap insulator. The addition of the insulating layer may serve to passivate the surface of the quantum dots, which may be a key to improving reliability. Additional insulator coating may be included to provide extremely high room temperature quantum yields, as well as isolation of an electronically active core from its surroundings, excellent temperature and light stability, and a pathway to a robust and stable composite with relevant plastics for LED applications. Essentially, in an embodiment, the insulator provides an extra barrier between the active quantum dot and the matrix, preventing oxidation of the surface, uncontrolled alloying, ligand loss and other undesirable high temperature processes. Since surface defects can be detrimental to room-temperature and high temperature performance of quantum dots, the addition of an amorphous layer can be key to their durability in the LED product. The above and other examples of architectures for quantum dots having one or more alloyed or graded compositional transition layer are illustrated in and described below in association with FIGS. 13-15.

Figure 13:
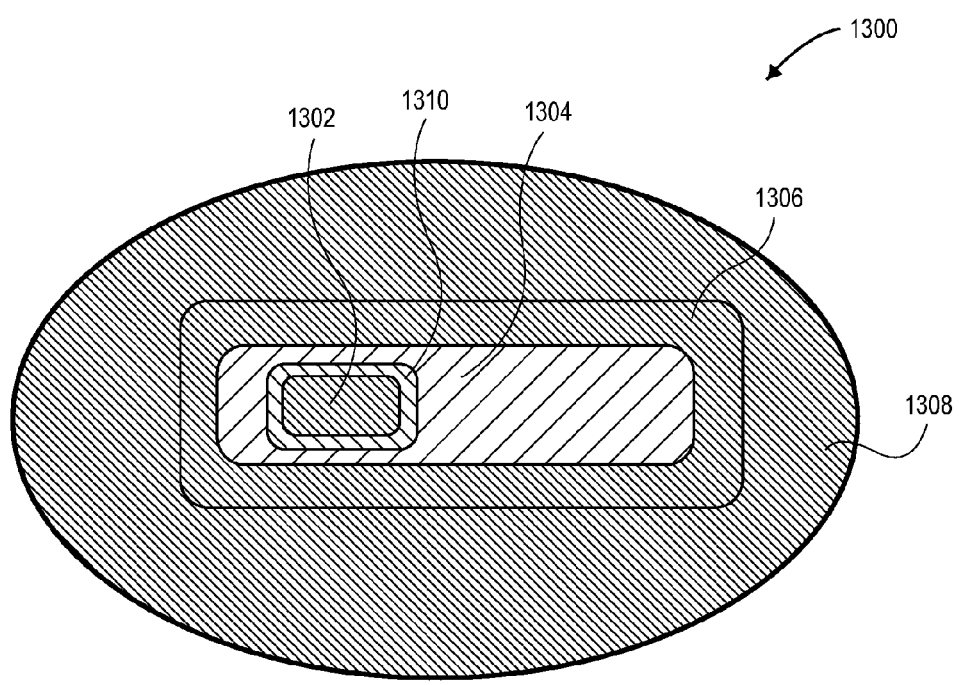
FIG. 13 illustrates a cross-sectional view of a semiconductor structure having a nanocrystalline core and nanocrystalline shell pairing with one compositional transition layer, in accordance with an embodiment of the present invention.

In a first example, FIG. 13 illustrates a cross-sectional view of a semiconductor structure having a nanocrystalline core and nanocrystalline shell pairing with one compositional transition layer, in accordance with an embodiment of the present invention.

Referring to FIG. 13, a semiconductor structure 1300 includes a nanocrystalline core 1302 composed of a first semiconductor material. A nanocrystalline shell 1304 composed of a second, different, semiconductor material at least partially surrounds the nanocrystalline core 1302. A compositional transition layer 1310 is disposed between, and in contact with, the nanocrystalline core 1302 and nanocrystalline shell 1304. The compositional transition layer 1310 has a composition intermediate to the first and second semiconductor materials.

In an embodiment, the compositional transition layer 1310 is an alloyed layer composed of a mixture of the first and second semiconductor materials. In another embodiment, the compositional transition layer 1310 is a graded layer composed of a compositional gradient of the first semiconductor material proximate to the nanocrystalline core 1302 through to the second semiconductor material proximate to the nanocrystalline shell 1304. In either case, in a specific embodiment, the compositional transition layer 1310 has a thickness approximately in the range of 1.5-2 monolayers. Exemplary embodiments include a structure 1300 where the first semiconductor material is cadmium selenide (CdSe), the second semiconductor material is cadmium sulfide (CdS), and the compositional transition layer 1310 is composed of $CdSe_xS_y$, where $0<x<1$ and $0<y<1$, or where the first semiconductor material is cadmium selenide (CdSe), the second semiconductor material is zinc selenide (ZnSe), and the compositional transition layer 1310 is composed of $Cd_xZn_ySe$, where $0<x<1$ and $0<y<1$.

In accordance with an embodiment of the present invention, the compositional transition layer 1310 passivates or reduces trap states where the nanocrystalline shell 1304 surrounds the nanocrystalline core 1302. Exemplary embodiments of core and/or shell parameters include a structure 1300 where the nanocrystalline core 1302 is an anisotropic nanocrystalline core having an aspect ratio between, but not including, 1.0 and 2.0 (in a specific embodiment, approximately in the range of 1.01-1.2), and the nanocrystalline shell is an anisotropic nanocrystalline shell having an aspect ratio approximately in the range of 4-6.

In an embodiment, the nanocrystalline shell 1304 completely surrounds the nanocrystalline core 1302, as depicted in FIG. 13. In an alternative embodiment, however, the nanocrystalline shell 1304 only partially surrounds the nanocrystalline core 1302, exposing a portion of the nanocrystalline core 1302. Furthermore, in either case, the nanocrystalline core 1302 may be disposed in an asymmetric orientation with respect to the nanocrystalline shell 1304. In one or more embodiments, semiconductor structures such as 1300 are fabricated to further include a nanocrystalline outer shell 1306 at least partially surrounding the nanocrystalline shell 1304. The nanocrystalline outer shell 1306 may be composed of a third semiconductor material different from the first and second semiconductor materials, i.e., different from the materials of the core 1302 and shell 1304. The nanocrystalline outer shell 1306 may completely surround the nanocrystalline shell 1304 or may only partially surround the nanocrystalline shell 1304, exposing a portion of the nanocrystalline shell 1304.

For embodiments including a nanocrystalline outer shell, an additional compositional transition layer may be included. Thus, in a second example, FIG. 14 illustrates a cross-sectional view of a semiconductor structure having a nanocrystalline core/nanocrystalline shell/nanocrystalline outer shell combination with two compositional transition layers, in accordance with an embodiment of the present invention.

Figure 14:
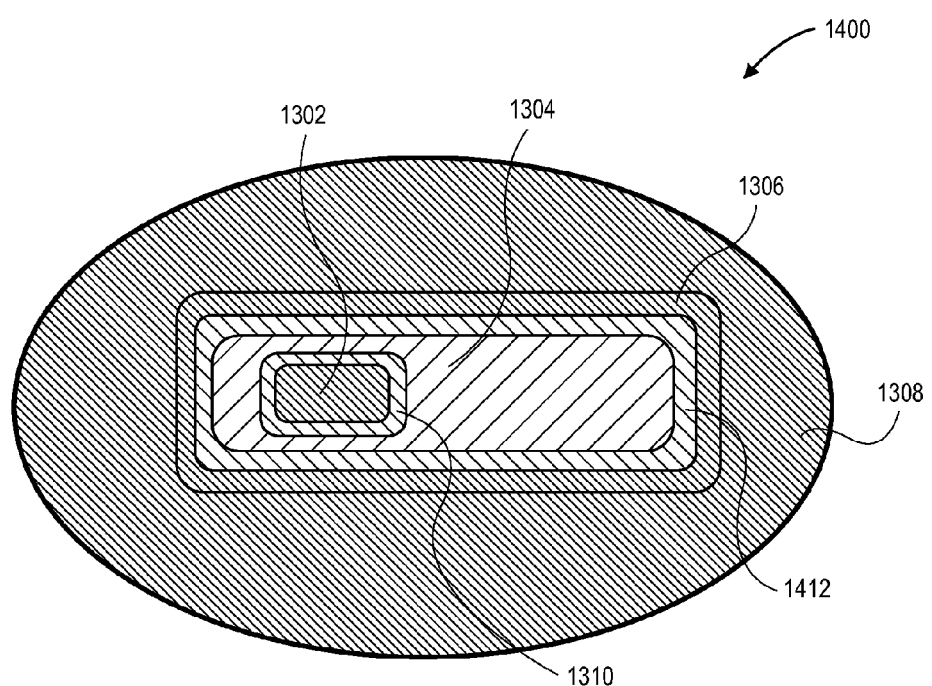
FIG. 14 illustrates a cross-sectional view of a semiconductor structure having a nanocrystalline core/nanocrystalline shell/nanocrystalline outer shell combination with two compositional transition layers, in accordance with an embodiment of the present invention.

Referring to FIG. 14, a semiconductor structure 1400 includes the nanocrystalline core 1302, nanocrystalline shell 1304, nanocrystalline outer shell 1306 and compositional transition layer 1310 of structure 1300. However, in addition, semiconductor structure 1400 includes a second compositional transition layer 1412 disposed between, and in contact with, the nanocrystalline shell 1304 and the nanocrystalline outer shell 1306. The second compositional transition layer 1412 has a composition intermediate to the second and third semiconductor materials, i.e., intermediate to the semiconductor materials of the shell 1304 and outer shell 1306.

In an embodiment, the second compositional transition layer 1412 is an alloyed layer composed of a mixture of the second and third semiconductor materials. In another embodiment, the second compositional transition layer 1412 is a graded layer composed of a compositional gradient of the second semiconductor material proximate to the nanocrystalline shell 1304 through to the third semiconductor material proximate to the nanocrystalline outer shell 1306. In either case, in a specific embodiment, the second compositional transition layer 1412 has a thickness approximately in the range of 1.5-2 monolayers. Exemplary embodiments include a structure 1400 where the first semiconductor material is cadmium selenide (CdSe), the second semiconductor material is cadmium sulfide (CdS), the third semiconductor material is zinc sulfide (ZnS), and the second compositional transition layer 1412 is composed of $Cd_xZn_yS$, where $0<x<1$ and $0<y<1$, or the first semiconductor material is cadmium selenide (CdSe), the second semiconductor material is zinc selenide (ZnSe), the third semiconductor material is zinc sulfide (ZnS), and the second compositional transition layer 1412 is composed of $ZnSe_xS_y$, where $0<x<1$ and $0<y<1$. In accordance with an embodiment of the present invention, the second compositional transition layer 1412 passivates or reduces trap states where the nanocrystalline outer shell 1306 surrounds the nanocrystalline shell 1304.

For other embodiments including a nanocrystalline outer shell, an outer compositional transition layer may be included without including an inner compositional transition layer. Thus, in a third example, FIG. 15 illustrates a cross-sectional view of a semiconductor structure having a nanocrystalline core/nanocrystalline shell/nanocrystalline outer shell combination with one compositional transition layer, in accordance with an embodiment of the present invention.

Figure 15:
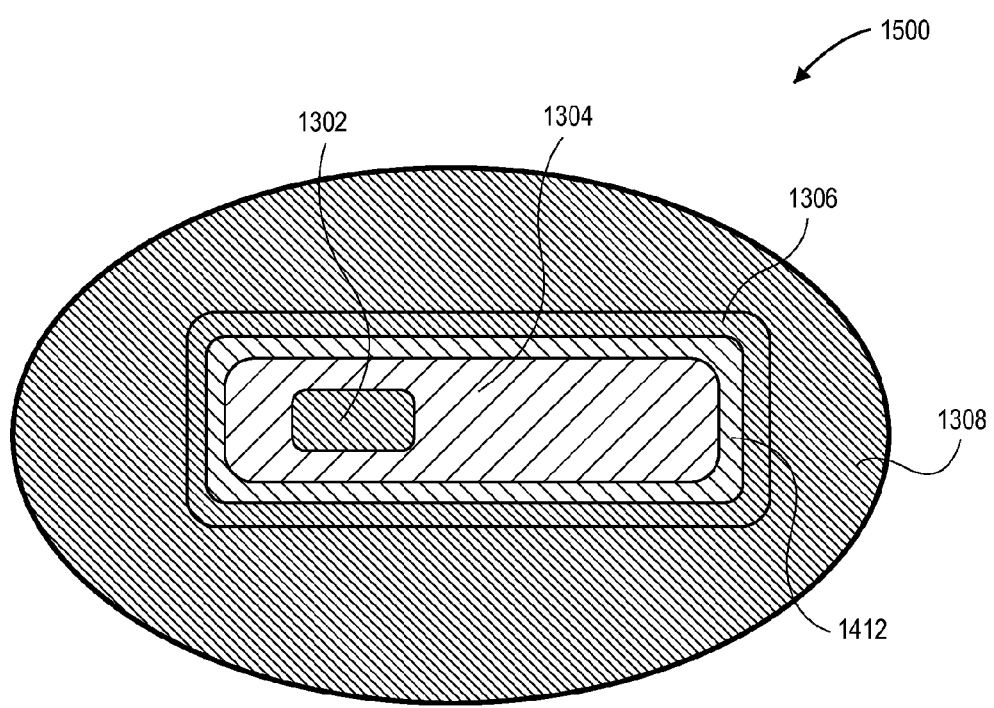
FIG. 15 illustrates a cross-sectional view of a semiconductor structure having a nanocrystalline core/nanocrystalline shell/nanocrystalline outer shell combination with one compositional transition layer, in accordance with an embodiment of the present invention.

Referring to FIG. 15, a semiconductor structure 1500 includes the nanocrystalline core 1302, nanocystalline shell 1304, and nanocrystalline outer shell 1306 of structure 1300. In addition, the semiconductor structure 1500 includes the compositional transition layer 1412 of structure 1400 disposed between, and in contact with, the nanocrystalline shell 1304 and the nanocrystalline outer shell 1306. However, structure 1500 does not include the compositional transition layer 1310 of structure 1300, i.e., there is no compositional transition layer between the core 1302 and shell 1304.

Referring to FIGS. 13-15, as depicted, the structures 1300, 1400 and 15500 may further include an insulator coating 1308 surrounding and encapsulating the nanocrystalline core/nanocrystalline shell pairing or nanocrystalline core/nanocrystalline shell/nanocrystalline outer shell combination. In one such embodiment, the insulator coating is composed of an amorphous material such as, but not limited to, silicon dioxide ($SiO_2$), silicon oxide ($SiO_x$), aluminum oxide ($Al_2O_3$), zirconia ($ZrO_x$), titania ($TiO_x$), or hafnia ($HfO_x$). In an embodiment, the structures 1300, 1400 and 1500 are quantum dot structures. For example, structures 1300, 1400 and 1500 may be used as a down-converting quantum dot or an up-shifting quantum dot.

A plurality of quantum dot structures such as structures 1300, 1400 or 1500 may be included in a composite having a matrix material and a plurality of the semiconductor structures embedded in the matrix material. In one such embodiment, each of the plurality of semiconductor structures is cross-linked with, polarity bound by, or tethered to the matrix material. In another such embodiment, each of the plurality of semiconductor structures is bound to the matrix material by a covalent, dative, or ionic bond. In either case, in a specific embodiment, one or more of the semiconductor structures further includes a coupling agent covalently bonded to an outer surface of the amorphous insulator coating 1308.

In another aspect, generally, individual quantum dots exhibit characteristic "on/off" events, termed blinking, which represent emission from neutral and charged species, respectively. It is this behavior that is believed to be responsible for the photobleaching behavior often observed in quantum dots. The formation of charged species is believed to arise from charge transfer from within the quantum dot to trap states at the core/shell interface, its surface, or the matrix, and increases as a function of incident intensity. Core volume and surface have been shown to be a significant parameter in blinking behavior. Of even greater importance may be the formation of smooth transitions between different epitaxial semiconductor layers.

Furthermore, changes to the core or seed size and overall dimensions of the nanocrystalline semiconductor particle may affect intrinsic particle performance and stability, and it is important to understand the changes in exciton dynamics in order to prevent or correct detrimental changes. Time resolved optical interrogation techniques may thus be used as part of the characterization process when changes to a quantum dot structure are made. Time resolved photoluminescence (TRPL) provides the excited state lifetime, as both a function of incident intensity and temperature. Transient absorption spectroscopy measures the change in the absorption coefficient of a sample after it is excited by a short (<1 ps) pulse at 400-450 nm. By monitoring the time-dependence of this change at different wavelengths (400 nm to 1200 nm) the radiative and non-radiative dynamics of the decay pathways can be investigated.

Figure 16:
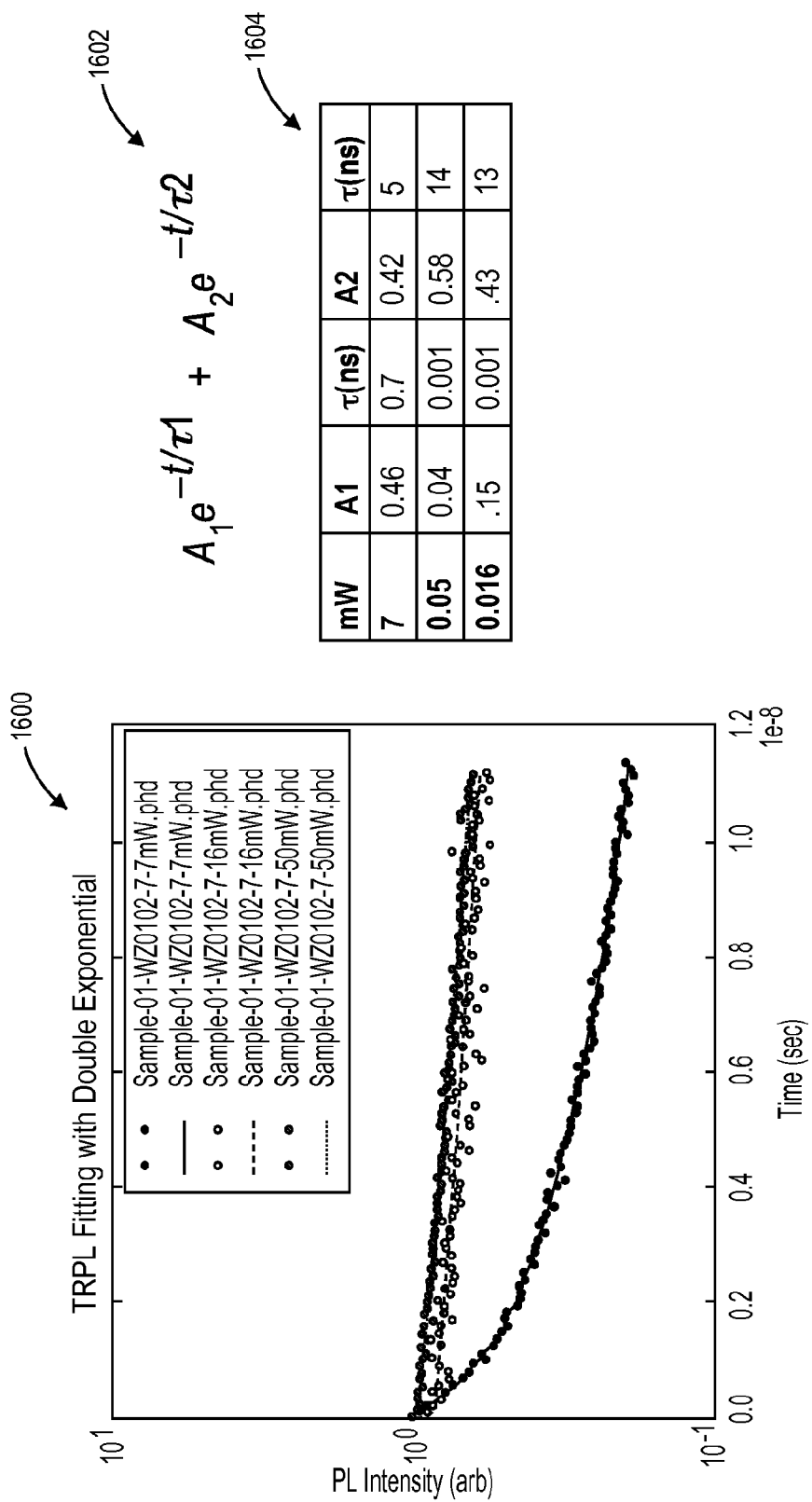
FIG. 16 is a plot of increasing photoluminescence (PL) intensity as a function of time (seconds) for non-alloyed rod materials, in accordance with an embodiment of the present invention.

Another characterization technique for analyzing high intensity behavior is PLQY at high flux and high temperature. By analyzing photoluminescence quantum yield at high flux and high temperature, the multi-exciton radiative efficiency and activation energy of trap-states can be ascertained. An example of time resolved photoluminescence of non-alloyed rod materials is given in FIG. 16. FIG. 16 is a plot 1600 of increasing photoluminescence (PL) intensity as a function of time (seconds), based on equation 1602 and data plot 1604, for non-alloyed rod materials. The time resolved photoluminescence is obtained at high fluence, e.g., 0.016 and 0.05 mW, with a radiative lifetime of approximately 13-14 nanoseconds. As the incident flux is increased by 2 orders of magnitude, a fast lifetime competes with regular lifetime, and regular lifetime decreases to 5 nanoseconds. A shorter radiative lifetime is better at high fluxes to reduce bi-exciton population. One or more embodiments described herein, such as structures 1300, 1400 or 1500, described above, provide quantum dot architectures suitable for multi-exciton radiative efficiency, e.g., for up-shifting or down-converting layers in lighting devices.

Thus, semiconductor structures having a nanocrystalline core and nanocrystalline shell pairing with one or more compositional transition layers have been disclosed.

What is claimed is:

1. A semiconductor structure, comprising:
a nanocrystalline core comprising a first semiconductor material;
a nanocrystalline shell comprising a second, different, semiconductor material at least partially surrounding the nanocrystalline core;
a first compositional transition layer disposed between, and in contact with, the nanocrystalline core and nanocrystalline shell, the first compositional transition layer having a composition intermediate to the first and second semiconductor materials;
a nanocrystalline outer shell at least partially surrounding the nanocrystalline shell, the nanocrystalline outer shell comprising a third semiconductor material different from the first and second semiconductor materials;
a second compositional transition layer disposed between, and in contact with, the nanocrystalline shell and the nanocrystalline outer shell, the second compositional transition layer having a composition intermediate to the second and third semiconductor materials; and
an insulator coating surrounding and encapsulating the nanocrystalline core/nanocrystalline shell/nanocrystalline outer shell structure.

2. The semiconductor structure of claim 1, wherein the first compositional transition layer is an alloyed layer comprising a mixture of the first and second semiconductor materials.

3. The semiconductor structure of claim 1, wherein the first compositional transition layer is a graded layer comprising a compositional gradient of the first semiconductor material proximate to the nanocrystalline core through to the second semiconductor material proximate to the nanocrystalline shell.

4. The semiconductor structure of claim 1, wherein the first compositional transition layer has a thickness approximately in the range of 1.5-2 monolayers.

5. The semiconductor structure of claim 1, wherein the first semiconductor material is cadmium selenide (CdSe), the second semiconductor material is cadmium sulfide (CdS), and the first compositional transition layer comprises $CdSe_xS_y$, where $0<x<1$ and $0<y<1$.

6. The semiconductor structure of claim 1, wherein the first semiconductor material is cadmium selenide (CdSe), the second semiconductor material is zinc selenide (ZnSe), and the first compositional transition layer comprises $Cd_xZn_ySe$, where $0<x<1$ and $0<y<1$.

7. The semiconductor structure of claim 1, wherein the first compositional transition layer passivates or reduces trap states where the nanocrystalline shell surrounds the nanocrystalline core.

8. The semiconductor structure of claim 1, wherein the second compositional transition layer is an alloyed layer comprising a mixture of the second and third semiconductor materials.

9. The semiconductor structure of claim 1, wherein the second compositional transition layer is a graded layer comprising a compositional gradient of the second semiconductor material proximate to the nanocrystalline shell through to the third semiconductor material proximate to the nanocrystalline outer shell.

10. The semiconductor structure of claim 1, wherein the second compositional transition layer has a thickness approximately in the range of 1.5-2 monolayers.

11. The semiconductor structure of claim 1, wherein the first semiconductor material is cadmium selenide (CdSe), the second semiconductor material is cadmium sulfide (CdS), the third semiconductor material is zinc sulfide (ZnS), and the second compositional transition layer comprises $Cd_xZn_yS$, where $0<x<1$ and $0<y<1$.

12. The semiconductor structure of claim 1, wherein the first semiconductor material is cadmium selenide (CdSe), the second semiconductor material is zinc selenide (ZnSe), the third semiconductor material is zinc sulfide (ZnS), and the second compositional transition layer comprises $ZnSe_xS_y$, where $0<x<1$ and $0<y<1$.

13. The semiconductor structure of claim 1, wherein the second compositional transition layer passivates or reduces trap states where the nanocrystalline outer shell surrounds the nanocrystalline shell.

14. The semiconductor structure of claim 1, wherein the nanocrystalline core is an anisotropic nanocrystalline core having an aspect ratio between, but not including, 1.0 and 2.0.

15. The semiconductor structure of claim 14, wherein the nanocrystalline shell is an anisotropic nanocrystalline shell having an aspect ratio approximately in the range of 4-6.

16. The semiconductor structure of claim 14, wherein the aspect ratio of the anisotropic nanocrystalline core is approximately in the range of 1.01-1.2.

17. The semiconductor structure of claim 1, wherein the insulator coating comprises an amorphous material selected from the group consisting of silicon dioxide ($SiO_2$), silicon oxide ($SiO_x$), aluminum oxide ($Al_2O_3$), zirconia ($ZrO_x$), titania ($TiO_x$), and hafnia ($HfO_x$).

18. The semiconductor structure of claim 1, wherein the nanocrystalline shell completely surrounds the nanocrystalline core.

19. The semiconductor structure of claim 1, wherein the nanocrystalline shell only partially surrounds the nanocrystalline core, exposing a portion of the nanocrystalline core.

20. The semiconductor structure of claim 1, wherein the nanocrystalline core is disposed in an asymmetric orientation with respect to the nanocrystalline shell.

21. The semiconductor structure of claim 1, wherein the semiconductor structure is a quantum dot.

22. The semiconductor structure of claim 21, wherein the quantum dot is a down-converting quantum dot.

23. The semiconductor structure of claim 21, wherein the quantum dot is an up-shifting quantum dot.

\* \* \* \* \*